United States Patent
Park et al.

(10) Patent No.: US 12,376,454 B2
(45) Date of Patent: Jul. 29, 2025

(54) DISPLAY DEVICE HAVING PIXEL ELECTRODE OVERLAPPING TRANSISTOR SEMICONDUCTOR LAYER

(71) Applicant: Samsung Display Co., Ltd., Yongin-si (KR)

(72) Inventors: Hyungjun Park, Yongin-si (KR); Wonkyu Kwak, Yongin-si (KR); Jaedu Noh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 525 days.

(21) Appl. No.: 17/298,187

(22) PCT Filed: Jun. 10, 2019

(86) PCT No.: PCT/KR2019/006940
§ 371 (c)(1),
(2) Date: May 28, 2021

(87) PCT Pub. No.: WO2020/111420
PCT Pub. Date: Jun. 4, 2020

(65) Prior Publication Data
US 2022/0115480 A1    Apr. 14, 2022

(30) Foreign Application Priority Data
Nov. 30, 2018    (KR) .................. 10-2018-0153021

(51) Int. Cl.
*H10K 59/121*    (2023.01)
*H10K 59/123*    (2023.01)
(Continued)

(52) U.S. Cl.
CPC ..... *H10K 59/1213* (2023.02); *H10K 59/1216* (2023.02); *H10K 59/123* (2023.02);
(Continued)

(58) Field of Classification Search
CPC ............ H10K 59/1213; H10K 59/353; H10K 59/131; H10K 59/126; H10K 59/1216; H10K 59/123
See application file for complete search history.

(56) References Cited

U.S. PATENT DOCUMENTS

| | | |
|---|---|---|
| 8,558,239 B2 | 10/2013 | Lee et al. |
| 9,748,321 B2 | 8/2017 | Kim et al. |

(Continued)

FOREIGN PATENT DOCUMENTS

| | | |
|---|---|---|
| CN | 106409868 | 2/2017 |
| CN | 107369690 | 11/2017 |

(Continued)

OTHER PUBLICATIONS

International Search Report, with English translation, corresponding to International Application No. PCT/KR2019/006940 dated Sep. 20, 2019.

(Continued)

*Primary Examiner* — Matthew E. Gordon
*Assistant Examiner* — Sean Ayers Winters
(74) *Attorney, Agent, or Firm* — KILE PARK REED & HOUTTEMAN PLLC

(57) ABSTRACT

A display device includes a first pixel circuit arranged in a first pixel region and including a first thin-film transistor including a first semiconductor layer; a second pixel circuit arranged in a second pixel region adjacent to the first pixel region, the second pixel circuit including a second thin-film transistor including a second semiconductor layer; a first pixel electrode electrically connected to the first pixel circuit; a second pixel electrode electrically connected to the second pixel circuit; and a shielding member extending in a row direction along a portion of edges of the first pixel electrode and the second pixel electrode.

25 Claims, 29 Drawing Sheets

(51) Int. Cl.
*H10K 59/126* (2023.01)
*H10K 59/131* (2023.01)
*H10K 59/35* (2023.01)

(52) U.S. Cl.
CPC ......... *H10K 59/126* (2023.02); *H10K 59/131* (2023.02); *H10K 59/353* (2023.02)

(56) References Cited

U.S. PATENT DOCUMENTS

| | | | |
|---|---|---|---|
| 10,446,711 | B2 | 10/2019 | Jeon et al. |
| 10,854,705 | B2 | 12/2020 | Ka et al. |
| 10,872,945 | B2 | 12/2020 | Choi |
| 10,903,298 | B2 | 1/2021 | Lee et al. |
| 2011/0175833 | A1* | 7/2011 | Kurokawa ........ H01L 27/14692 345/173 |
| 2011/0194059 | A1* | 8/2011 | Yamazaki ........... G02F 1/13439 349/138 |
| 2014/0084286 | A1 | 3/2014 | Jeon et al. |
| 2015/0346572 | A1* | 12/2015 | Hirosawa .......... G02F 1/134363 349/43 |
| 2016/0079333 | A1* | 3/2016 | Shishido ............ H10K 59/352 257/72 |
| 2017/0033171 | A1 | 2/2017 | Kim et al. |
| 2017/0069696 | A1 | 3/2017 | Kondo |
| 2017/0140706 | A1 | 5/2017 | Song et al. |
| 2017/0170200 | A1* | 6/2017 | Ikeda .................. G09G 3/2003 |
| 2017/0288004 | A1 | 10/2017 | Kim et al. |
| 2017/0294502 | A1 | 10/2017 | Ka et al. |
| 2017/0330927 | A1 | 11/2017 | Lee et al. |
| 2018/0314086 | A1* | 11/2018 | Tateno .............. G02F 1/133512 |
| 2019/0081076 | A1* | 3/2019 | Okada .................. H01L 27/124 |
| 2020/0279901 | A1 | 9/2020 | Choi et al. |
| 2020/0403052 | A1 | 12/2020 | Kim et al. |

FOREIGN PATENT DOCUMENTS

| | | |
|---|---|---|
| KR | 10-1117725 | 3/2012 |
| KR | 10-2014-0039617 | 4/2014 |
| KR | 10-2016-0017394 | 2/2016 |
| KR | 10-2017-0014087 | 2/2017 |
| KR | 10-2017-0058492 | 5/2017 |
| KR | 10-2017-0115177 | 10/2017 |
| KR | 10-2017-0117291 | 10/2017 |
| KR | 10-2017-0127602 | 11/2017 |
| KR | 10-2018-0040185 | 4/2018 |
| KR | 10-2018-0088550 | 8/2018 |
| WO | 2011-065607 | 6/2011 |

OTHER PUBLICATIONS

Written Opinion, with English translation, corresponding to International Application No. PCT/KR2019/006940, dated Sep. 20, 2019.

* cited by examiner

DISPLAY DEVICE HAVING PIXEL ELECTRODE OVERLAPPING TRANSISTOR SEMICONDUCTOR LAYER

CROSS-REFERENCE TO RELATED APPLICATION(S)

This application is a national entry of International Application No. PCT/KR2019/006940, filed on Jun. 10, 2019, which claims under 35 U.S.C. §§ 119(a) and 365(b) priority to and benefits of Korean Patent Application No. 10-2018-0153021, filed on Nov. 30, 2018 in the Korean Intellectual Property Office (KIPO), the entire contents of which are incorporated herein by reference.

BACKGROUND

1. Technical Field

One or more embodiments relate to a display device.

2. Description of the Related Art

Display devices include a display element and electronic elements for controlling an electrical signal that is applied to the display element. The electronic elements include a thin-film transistor (TFT), a capacitor, and a plurality of lines.

To accurately control light emission or non-light-emission of a display element and a light-emission degree thereof, the number of TFTs electrically connected to one display element has been increased, and the number of lines configured to transmit an electrical signal to the TFTs has also been increased.

SUMMARY

One or more embodiments include a display device realizing a high resolution with an improved display quality. However, the one or more embodiments are only examples, and the scope of the disclosure is not limited thereto.

According to an aspect of the disclosure, a display device may include a first pixel circuit arranged in a first pixel region, the first pixel including a first thin-film transistor including a first semiconductor layer; a second pixel circuit arranged in a second pixel region adjacent to the first pixel region, the second pixel circuit including a second thin-film transistor including a second semiconductor layer; a first pixel electrode electrically connected to the first pixel circuit; a second pixel electrode electrically connected to the second pixel circuit; and a shielding member extending in a row direction along a portion of edges of the first pixel electrode and the second pixel electrode. The first pixel electrode at least partially overlaps the first semiconductor layer of the first thin-film transistor, and the shielding member at least partially may overlap the second semiconductor layer of the second thin-film transistor.

The shielding member may be connected to other shielding members arraigned in rows.

The shielding member may be floating.

The shielding member may have a constant voltage.

The second pixel circuit may further include a capacitor including a first electrode, the first electrode and a gate electrode of the second thin-film transistor being arranged on a same layer, and a second electrode arranged over the first electrode; and a switching thin-film transistor electrically connected to a data line arranged over the capacitor.

The shielding member may be arranged on a layer between the data line and the second pixel electrode.

The second pixel circuit may further include an electrode pattern at least partially overlapping a semiconductor layer of the switching thin-film transistor, the electrode pattern and the second electrode of the capacitor being arranged on a same layer. The data line may at least partially overlap the electrode pattern.

The display device may further include an opening area, a display area at least partially surrounding the opening area, and a non-display area located between the opening area and the display area and surrounding the opening area. The shielding member may be disconnected in the non-display area.

The display device may further include a detour line surrounding the opening area, and the shielding member may be connected to the detour line.

The detour line and the shielding member may be arranged on a same layer.

According to an aspect of the disclosure, a display device may include a first pixel circuit arranged in a first pixel region, the first pixel circuit including a first thin-film transistor including a first semiconductor layer; a second pixel circuit arranged in a second pixel region adjacent to the first pixel region, the second pixel circuit including a second thin-film transistor including a second semiconductor layer; a third pixel circuit arranged in a third pixel region adjacent to the second pixel region, the third pixel circuit including a third thin-film transistor including a third semiconductor layer; a first pixel electrode electrically connected to the first pixel circuit; a second pixel electrode electrically connected to the second pixel circuit; a third pixel electrode electrically connected to the third pixel circuit; and a shielding member extending in a row direction along a portion of edges of the first pixel electrode, the second pixel electrode, and the third pixel electrode. The first pixel electrode may at least partially overlap a third semiconductor layer of a third thin-film transistor arranged in a third pixel region in an adjacent row. The third pixel electrode at least partially overlaps a first semiconductor layer of a first thin-film transistor arranged in a first pixel region in an adjacent row. The shielding member at least partially overlaps the second semiconductor layer of the second thin-film transistor.

The shielding member may be connected to other shielding members arraigned in rows.

The shielding member may be floating.

The shielding member may have a constant voltage.

The second pixel circuit may further include a capacitor including a first electrode, the first electrode and a gate electrode of the second thin-film transistor being arranged on a same layer; and a second electrode arranged over the first electrode; and a switching thin-film transistor electrically connected to a data line arranged over the capacitor.

The shielding member may be arranged on a layer between the data line and the second pixel electrode.

The second pixel circuit may further include an electrode pattern at least partially overlapping a semiconductor layer of the switching thin-film transistor, the electrode pattern and the second electrode of the capacitor is arranged on a same layer. The data line may at least partially overlap the electrode pattern.

The display device may further include an opening area, a display area at least partially surrounding the opening area, and a non-display area located between the opening area and the display area and surrounding the opening area. The shielding member may be disconnected in the non-display area.

The display device may further include a detour line surrounding the opening area. The shielding member may be connected to the detour line.

The detour line and the shielding member may be arranged on a same layer.

The shielding member may have a zigzag shape.

The first pixel circuit may be a pixel circuit of one of a red pixel and a green pixel, and the third pixel circuit may be a pixel circuit of one of the red pixel and the green pixel. The second pixel circuit may be a pixel circuit of a blue pixel.

According to an aspect of the disclosure, a display device may include a first pixel circuit arranged in a first pixel region, the first pixel circuit including a first thin-film transistor including a first semiconductor layer; and a second pixel circuit arranged in a second pixel region adjacent to the first pixel region, the second pixel circuit including a second thin-film transistor including a second semiconductor layer. A first pixel electrode electrically connected to the first pixel circuit may overlap at least a portion of the first semiconductor layer of the first thin-film transistor, and at least a portion of the second semiconductor layer of the second thin-film transistor that is in a same row or in an adjacent row.

The second pixel circuit may further include a capacitor including a first electrode, the first electrode and a gate electrode of the second thin-film transistor being arranged on a same layer, and a second electrode over the first electrode; a switching thin-film transistor electrically connected to a data line arranged over the capacitor; and an electrode pattern at least partially overlapping a semiconductor layer of the switching thin-film transistor, the electrode pattern and the second electrode of the capacitor being arranged on a same layer. The data line at least partially may overlap the electrode pattern.

Display devices according to embodiments of the disclosure may provide a high quality image by an optimal pixel arrangement and minimizing an external impact on thin-film transistors in a pixel. Of course, the scope of the disclosure is not limited thereto.

BRIEF DESCRIPTION OF DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
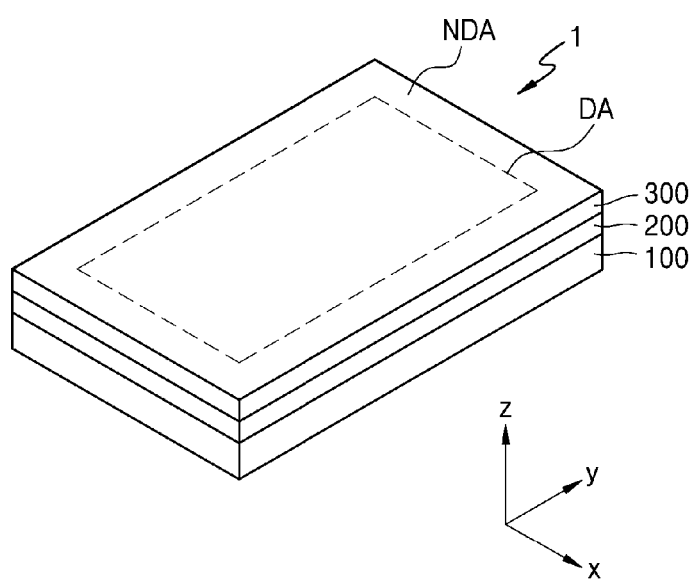
FIG. 1 is a schematic perspective view of a display device according to an embodiment of the disclosure.

According to an embodiment of the disclosure, a display device includes a first pixel circuit arranged in a first pixel region and including a first thin-film transistor including a first semiconductor layer; a second pixel circuit arranged in a second pixel region adjacent to the first pixel region, the second pixel circuit including a second thin-film transistor including a second semiconductor layer; a first pixel electrode electrically connected to the first pixel circuit; a second pixel electrode electrically connected to the second pixel circuit; and a shielding member extending in a row direction along a portion of an edge of the first pixel electrode and the second pixel electrode, wherein the first pixel electrode at least partially overlaps the first semiconductor layer of the first thin-film transistor and the shielding member at least partially overlaps the second semiconductor layer of the second thin-film transistor.

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the disclosure are shown. The disclosure may, however, be embodied in many different forms and should not be construed as limited to the embodiments set forth herein.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural form as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. For example, intervening layers, regions, or elements may be present.

Sizes of elements in the drawings may be exaggerated for convenience of explanation. In other words, since sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the detailed description and claims of the present disclosure, the term "correspondence" is used to specify an element arranged in the same area from among a plurality of elements according to the context. In other words, when a first member "corresponds" with one of a plurality of second members, this means that the second member is arranged on the same area as the first member. For example, a first electrode corresponding to one of a plurality of second electrodes may mean that the first electrode and the second electrode corresponding to the first electrode are arranged on the same pixel region.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

One or more embodiments of the disclosure will be described below in more detail with reference to the accompanying drawings. Those elements that are the same as or are in correspondence with each other are rendered the same reference numeral regardless of the figure number, and redundant explanations are omitted.

Figure 2:
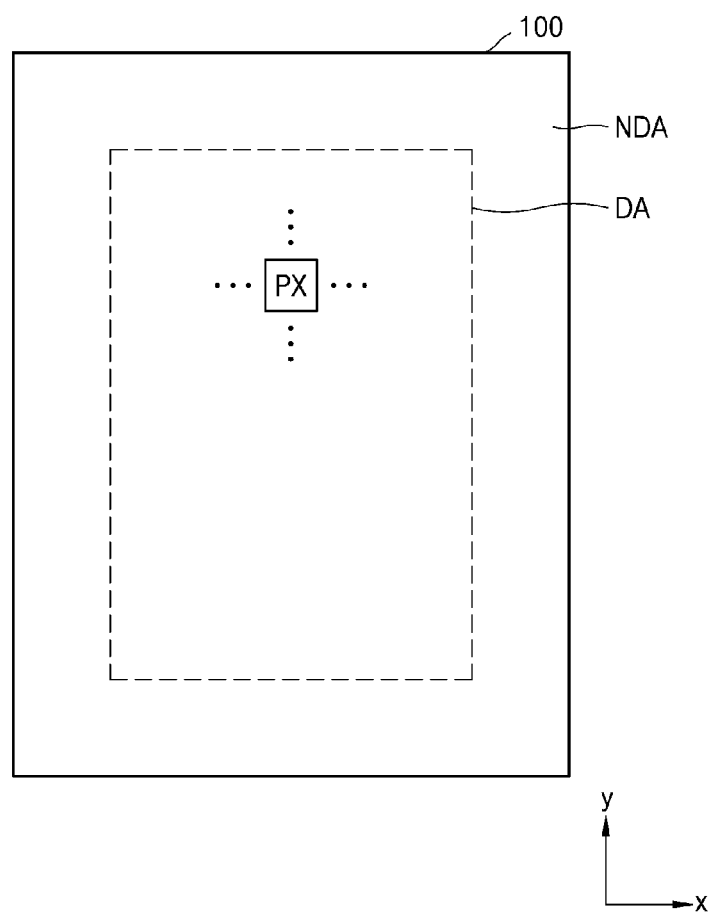
FIG. 2 is a plan view of a portion of the display device according to an embodiment of the disclosure.
Figure 3:
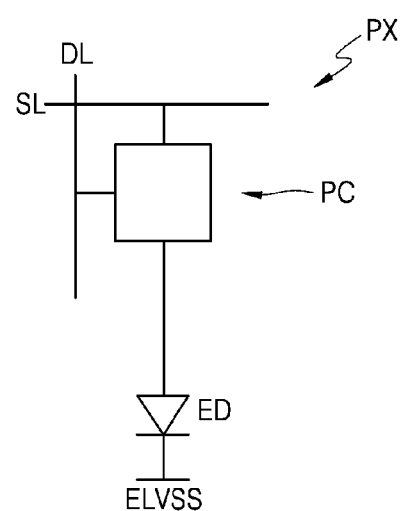
FIGS. 3 and 4 are views illustrating an example of a pixel according to an embodiment of the disclosure.
Figure 4:
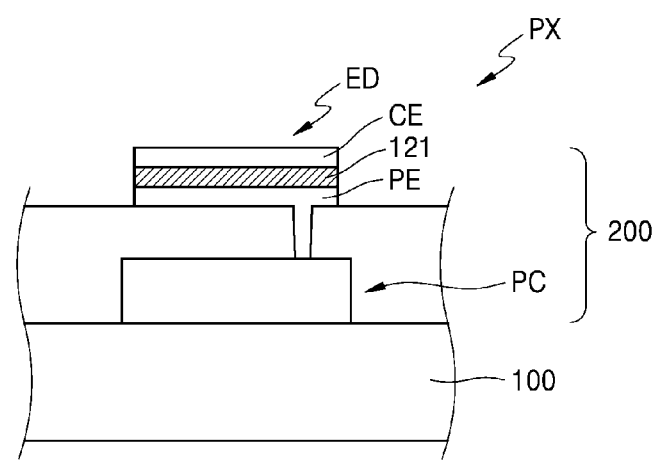

FIG. 1 is a schematic perspective view of a display device according to an embodiment. FIG. 2 is a schematic plan view of a portion of the display device according to an embodiment. FIGS. 3 and 4 are views illustrating an example of a pixel according to an embodiment.

Referring to FIGS. 1 and 2, a display device 1 according to an embodiment may include a display area DA that emits light, and a non-display area NDA that emits no light. The non-display area NDA may be arranged adjacent to the display area DA. Various lines and driving circuits for transmitting electrical signals to the display area DA may be positioned in the non-display area NDA. The display device 1 may provide an image by using light emitted from pixels PX arranged in the display area DA.

The display device 1 may include a display panel including a substrate 100, a display element layer 200, and an encapsulation member 300 sequentially stacked in a third direction (z direction).

The substrate 100 may include a glass material or may include a polymer resin. For example, the substrate 100 may include a glass material mainly containing $SiO_2$, or may include various flexible or bendable materials, e.g., a resin such as reinforced plastic. Although not shown in the drawings, the substrate 100 may be bent including a bending area in an area of the non-display area NDA.

The display element layer 200 may be positioned over the substrate 100 to correspond to the display area DA and may include pixels PX arranged in a pattern in a first direction (an x direction, for example, a row direction) and a second direction (a y direction, for example, a column direction). Referring to FIGS. 3 and 4, each pixel PX may include a pixel circuit PC electrically connected to a scan line SL and a data line DL and a display element ED electrically connected to the pixel circuit PC. The pixel circuit PC may include a thin-film transistor and a capacitor, and the display element ED may include an organic light-emitting diode OLED. The organic light-emitting diode OLED may include a pixel electrode PE, a counter electrode CE, and an emission layer 121 between the pixel electrode PE and the counter electrode CE. The display element ED may be arranged on a layer over the pixel circuit PC, and insulating layers may be arranged between the pixel circuit PC and the display element ED.

The display element layer 200 may be sealed by the encapsulation member 300 facing the substrate 100. The encapsulation member 300 may cover the display element layer 200 and extend beyond the display element layer 200. The encapsulation member 300 may be an encapsulation substrate or may be a thin-film encapsulation including at least one thin film. The thin-film encapsulation may include at least one inorganic layer including an inorganic material and at least one organic layer including an organic material. In an embodiment, the thin-film encapsulation may have a stack structure of first inorganic layer/organic layer/second inorganic layer.

Although not shown in the drawings, various functional layers such as a touch screen layer and an optical layer may be provided over the encapsulation member 300. A window may be arranged on the encapsulation member 300 and may be coupled or connected thereto via a pressure sensitive adhesive (PSA).

Figure 5:
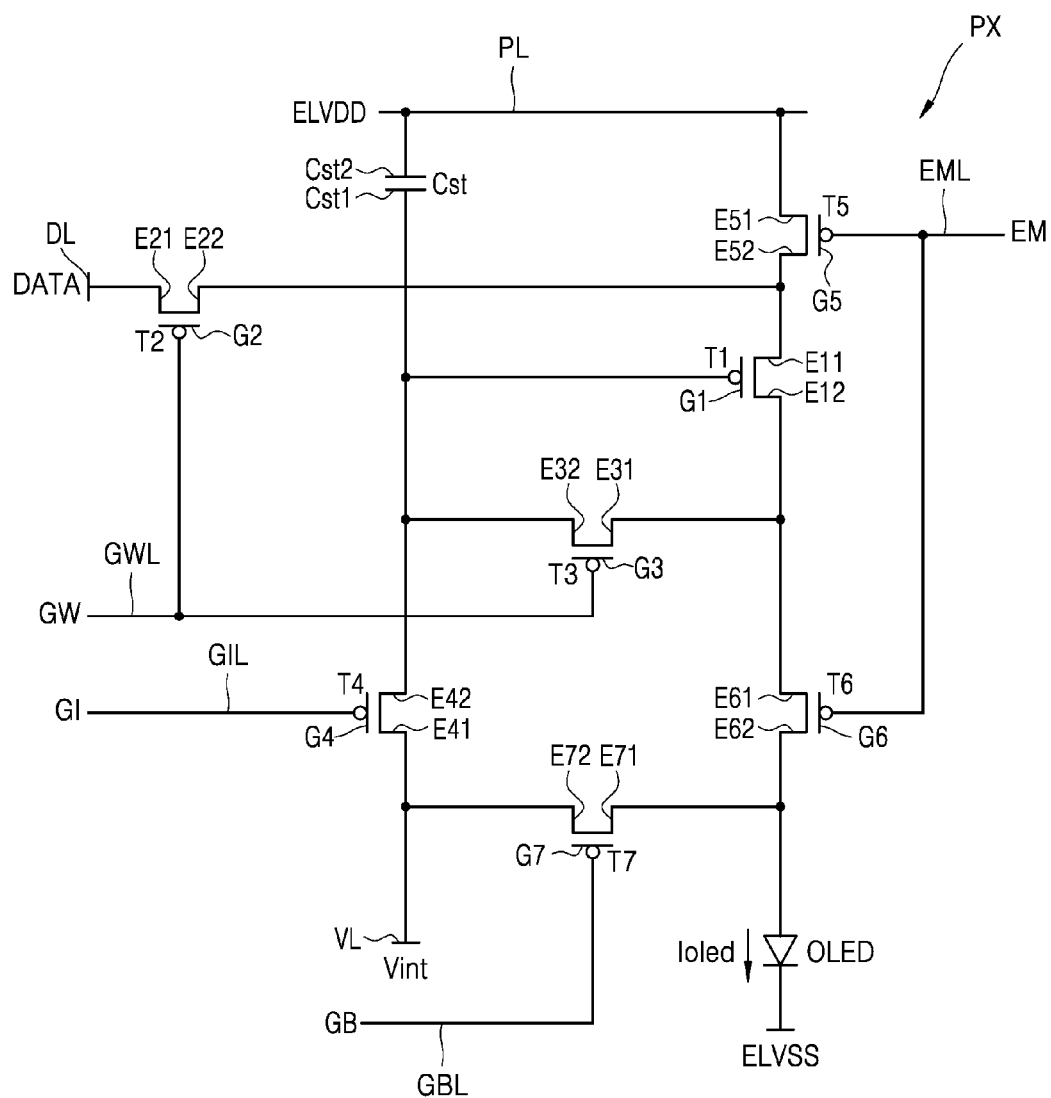
FIG. 5 is an equivalent circuit diagram of a pixel according to an embodiment of the disclosure.

FIG. 5 is a schematic diagram of an equivalent circuit of a pixel according to an embodiment.

Referring to FIG. 5, a pixel PX may be a display element that emits light, and may include an organic light-emitting diode OLED and a pixel circuit that receives signals from lines and drives the organic light-emitting diode OLED.

The lines may include signal lines, an initializing voltage line VL, and a driving voltage line PL configured to provide a first power supply voltage ELVDD. The signal lines may include a first scan line GIL configured to transmit a first scan signal GI, a second scan line GWL configured to transmit a second scan signal GW, a third scan line GBL configured to transmit a third scan signal GB, a light-emission control line EML configured to transmit a light-emission control signal EM, and a data line DL configured to transmit a data signal DATA. The third scan line GBL may be a first scan line GIL or second scan line GWL in a next row or previous row, and the third scan signal GB may be a first scan signal GI or second scan signal GW in a next row or previous row.

Although FIG. 5 illustrates that each pixel PX is electrically connected to the signal lines GIL, GWL, GBL, EML, and DL, the initializing voltage line VL, and the driving voltage line PL, the disclosure is not limited thereto. In an embodiment, the initializing voltage line VL, the driving voltage line PL, and at least one of the signal lines GIL, GWL, GBL, EML, and DL may be shared by neighboring pixels.

The pixel circuit PC of the pixel PX may include transistors, for example, first to seventh transistors T1 to T7, and a capacitor Cst. First electrodes E11 to E71 and second electrodes E12 to E72 of FIG. 5 may be a source electrode (source region) or a drain electrode (drain region) according to the type (p-type or n-type) and/or operating conditions of transistors. The first to seventh transistors T1 to T7 may be thin-film transistors.

The first transistor T1 may include a gate electrode G1 electrically connected to a first electrode Cst1 of the capacitor Cst, a first electrode E11 electrically connected to the driving voltage line PL via the fifth transistor T5, and a second electrode E12 electrically connected to a pixel electrode PE of the organic light-emitting diode OLED via the sixth transistor T6. The first transistor T1 may function as a driving transistor and may receive the data signal DATA according to a switching operation of the second transistor T2 and supply a driving current $I_{oled}$ to the organic light-emitting diode OLED.

The second transistor T2 may include a gate electrode G2 electrically connected to the second scan line GWL, a first electrode E21 electrically connected to the data line DL, and a second electrode E22 electrically connected to the first electrode E11 of the first transistor T1. The second transistor T2 may be turned on according to the second scan signal GW received via the second scan line GWL to perform a switching operation of transmitting the data signal DATA, received via the data line DL, to the first electrode E11 of the first transistor T1.

The third transistor T3 may include a gate electrode G3 electrically connected to the second scan line GWL, a first electrode E31 electrically connected to the second electrode E12 of the first transistor T1, and a second electrode E32 electrically connected to the first capacitor Cst1 of the capacitor Cst, a second electrode E42 of the fourth transistor T4, and the gate electrode G1 of the first transistor T1. The third transistor T3 may be turned on according to the second scan signal GW received via the second scan line GWL and diode-connect the first transistor T1.

The fourth transistor T4 may include a gate electrode G4 electrically connected to the first scan line GIL, a first electrode E41 electrically connected to the initializing voltage line VL, and a second electrode E42 electrically connected to the first electrode Cst1 of the capacitor Cst, the second electrode E32 of the third transistor T3, and the gate electrode G1 of the first transistor T1. The fourth transistor T4 may be turned on according to the first scan signal GI received via the first scan line GIL and perform an initialization operation of transmitting an initializing voltage Vint to the gate electrode G1 of the first transistor T1 to initialize a gate voltage of the first transistor T1.

The fifth transistor T5 may include a gate electrode G5 electrically connected to the light-emission control line EML, a first electrode E51 electrically connected to the driving voltage line PL, and a second electrode E52 electrically connected to the first electrode E11 of the first transistor T1 and the second electrode E22 of the second transistor T2.

The sixth transistor T6 may include a gate electrode G6 electrically connected to the light-emission control line EML, a first electrode E61 electrically connected to the second electrode E12 of the first transistor T1 and the first electrode E31 of the third transistor T3, and a second electrode E62 electrically connected to the pixel electrode PE of the organic light-emitting diode OLED.

The fifth transistor T5 and the sixth transistor T6 may be simultaneously turned on according to the light-emission control signal EM received via the light-emission control line EML, and thus a current may flow in the organic light-emitting diode OLED.

The seventh transistor T7 may include a gate electrode G7 electrically connected to the third scan line GBL, a first electrode E71 electrically connected to the second electrode E62 of the sixth transistor T6 and the pixel electrode of the organic light-emitting diode OLED, and a second electrode E72 electrically connected to the initializing voltage line VL. The seventh transistor T7 may be turned on according to the third scan signal GB received via the third scan line GBL and perform an initialization operation of transmitting the initializing voltage Vint to the pixel electrode PE of the organic light-emitting diode OLED to initialize a voltage of the pixel electrode PE of the organic light-emitting diode OLED. The seventh transistor T7 may be omitted.

The capacitor Cst may include the first electrode Cst1 electrically connected to the gate electrode G1 of the first transistor T1 and a second electrode Cst2 electrically connected to the driving voltage line PL. The first electrode Cst1 of the capacitor Cst may be electrically connected to the second electrode E32 of the third transistor T3 and the second electrode E42 of the fourth transistor T4.

The organic light-emitting diode OLED may include the pixel electrode PE and a counter electrode CE facing the pixel electrode, and the counter electrode CE may receive a second power supply voltage ELVSS. The counter electrode CE may be a common electrode common to the pixels PX. The second power supply voltage ELVSS may be lower than the first power supply voltage ELVDD.

An intermediate layer may be included between the pixel electrode PE and the counter electrode CE of the organic light-emitting diode OLED. The intermediate layer may include an emission layer that emits light. However, the intermediate layer may further include at least one layer selected from a hole injection layer (HIL), a hole transport layer (HTL), an electron transport layer (ETL), and an electron injection layer (EIL). However, the embodiment is not limited thereto, and various other functional layers may be further arranged between the pixel electrode PE and the counter electrode CE.

The emission layer may be an organic emission layer and may emit red light, green light, or blue light. However, embodiments are not limited thereto, and the emission layer may emit white light. The emission layer may have a structure in which a light-emission material for emitting red light, a light-emission material for emitting green light, and a light-emission material for emitting blue light are stacked, or may have a structure in which a light-emission material for emitting red light, a light-emission material for emitting green light, and a light-emission material for emitting blue light are mixed.

The organic light-emitting diode OLED may receive the driving current $I_{oled}$ from the first transistor T1 and emit light of a color, thereby displaying an image.

Although FIG. 5 illustrates that the pixel circuit PC includes seven transistors and a capacitor, embodiments are not limited thereto. The number of transistors and capacitors may vary, such as, 6 or less or 8 or more, according to a design of the pixel circuit PC. However, for convenience of explanation, the pixel circuit PC of FIG. 5 will now be described.

Figure 6:
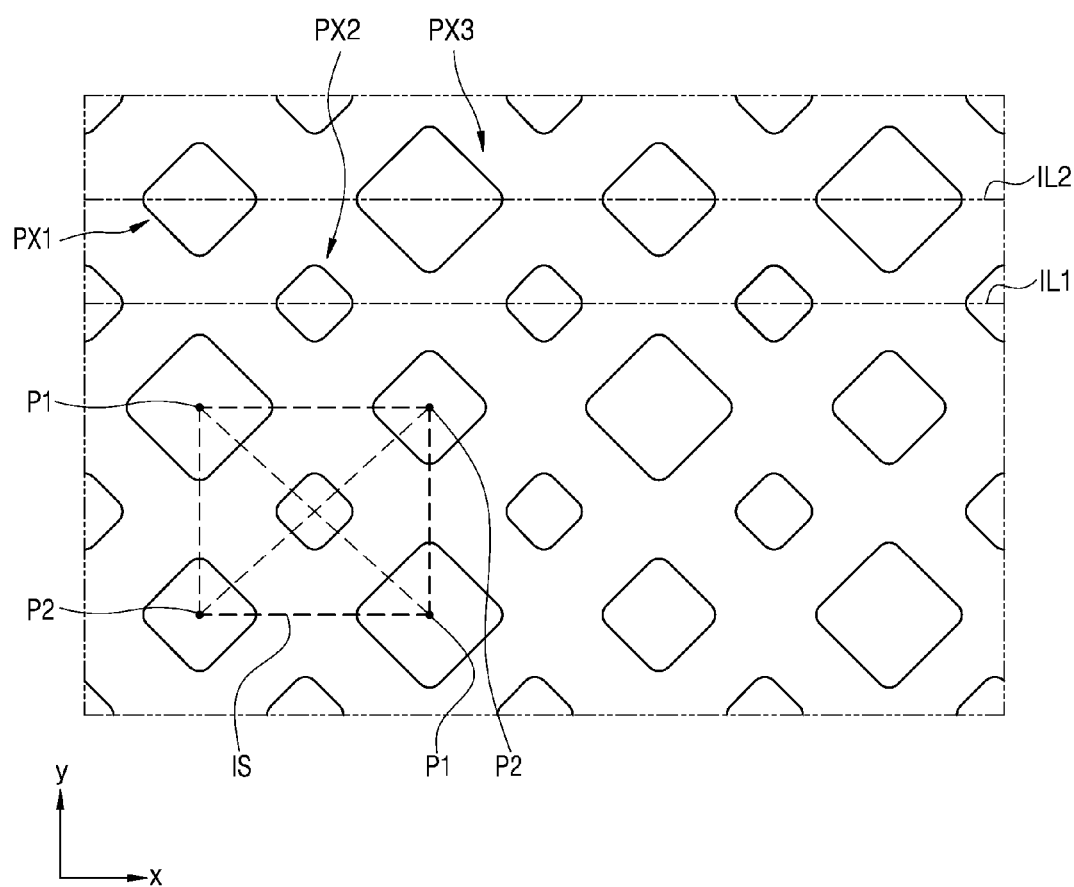
FIG. 6 is a partial plan view illustrating a pixel arrangement according to an embodiment of the disclosure.

FIG. 6 is a schematic partial plan view illustrating a pixel arrangement according to an embodiment.

Referring to FIG. 6, pixels arranged in the display area DA may include a first pixel PX1, a second pixel PX2, and a third pixel PX3. The first pixel PX1, the second pixel PX2, and the third pixel PX3 may be repeatedly arranged according to a pattern in column and row directions.

The first pixel PX1, the second pixel PX2, and the third pixel PX3 of FIG. 6 may be an organic light-emitting diode OLED of the first pixel PX1, an organic light-emitting diode OLED of the second pixel PX2, and an organic light-emitting diode OLED of the third pixel PX3, respectively. In more detail, an arrangement of the pixels PX of FIG. 6 may be an arrangement of respective pixel electrodes of the organic light-emitting diodes OLED of the first pixel PX1, the second pixel PX2, and the third pixel PX3. Because the light-emission area of a pixel electrode determines an aperture ratio of a pixel, an arrangement of pixel electrodes will be described as a pixel arrangement herein for convenience of explanation. In other words, the shape of a pixel may be that of an organic light-emitting diode. The organic light-emitting diode OLED of a pixel PX may be arranged directly over the pixel circuit PC thereof to overlap the pixel circuit PC, or may be offset from the pixel circuit PC thereof to overlap a pixel circuit PC of a pixel PX in another adjacent column or row.

The second pixel PX2 may have a small area compared with the first pixel PX1 and the third pixel PX3 that are adjacent to the second pixel PX2. The second pixels PX2 may be spaced apart from each other and arranged on a virtual first straight line IL1. Each second pixel PX2 may have a shape such as a polygon, for example, a rectangle or an octagon, a circle, an oval, or the like. Examples of the polygon may also include a shape of which vertexes are rounded.

Third pixels PX3 may be positioned at a pair of first vertexes P1 opposite to each other in a virtual rectangle IS with a second pixel PX2 as its center, and first pixels PX1 may be positioned at a pair of second vertexes P2 opposite to each other in the virtual rectangle IS. The virtual rectangle IS may be a square.

The first pixels PX1 may be spaced apart from the second pixel PX2 and the third pixels PX3 and be positioned at the second vertexes P2 adjacent to the first vertexes P1. Each first pixel PX1 may have a large area compared with a neighboring second pixel PX2. Each first pixel PX1 may have a shape such as a polygon, for example, a rectangle or an octagon, a circle, an oval, or the like. Examples of the polygon may also include a shape of which vertexes are rounded.

The third pixels PX3 may be spaced apart from the first pixels PX1 and the second pixels PX2 and be positioned at the first vertexes P1 of the virtual rectangle IS. Each third pixel PX3 may have a large area compared with its neighboring second pixel PX2. Each third pixel PX3 may have a different area from each first pixel PX1. For example, the third pixel PX3 may have a large area compared with the first pixel PX1. In an embodiment, each third pixel PX3 and each first pixel PX1 may have a same area. Each third pixel PX3 may have a shape such as a polygon, for example, a rectangle or an octagon, a circle, an oval, or the like. Examples of the polygon may also include a shape of which vertexes are rounded.

First pixels PX1 and third pixels PX3 may be alternately arranged on a virtual second straight line IL2. Therefore, third pixels PX3 positioned at the first vertexes P1 and first pixels PX1 positioned at the second vertexes P2 may surround a second pixel PX2.

Pixels may be repeatedly arranged in the first direction in the order of a first pixel PX1, a second pixel PX2, a third pixel PX3, and a second pixel PX2. In the second direction, first pixels PX1 and third pixels PX3 may be alternately repeated in a first column, second pixels PX2 may be repeated in a second column adjacent to the first column, third pixels PX3 and first pixels PX1 may be alternately repeated in a third column adjacent to the second column in a reverse order to that in the first column, and second pixels PX2 may be repeated in a fourth column adjacent to the third column.

In an embodiment, the first pixels PX1 may be red pixels that emit red light, the second pixels PX2 may be blue pixels that emit blue light, and the third pixels PX3 may be green pixels that emit green light. In an embodiment, the first pixels PX1 may be red pixels R, the second pixels PX2 may be green pixels G, and the third pixels PX3 may be blue pixels B.

Display devices 1 according to embodiments described below may include at least one shielding member that covers at least a portion (in particular, at least a portion of a semiconductor layer) of at least one thin-film transistor of a pixel circuit PC arranged in a layer below an organic light-emitting diode OLED. The shielding member may shield the thin-film transistor from an influence of externally incident light and/or other neighboring electrical signals.

Figure 7:
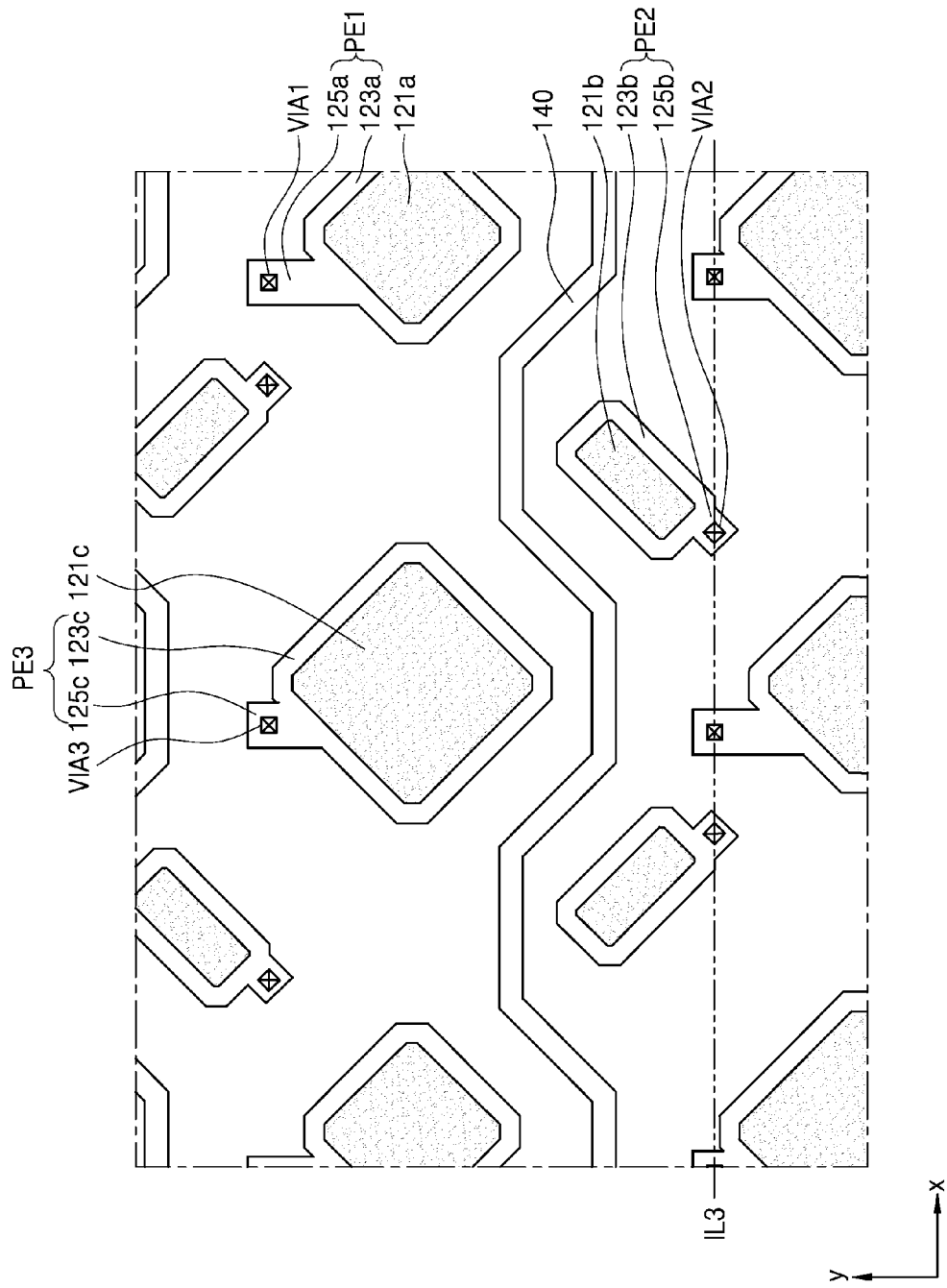
FIGS. 7 through 9 are plan views and a cross-sectional view each illustrating a shielding member according to an embodiment of the disclosure.
Figure 8:
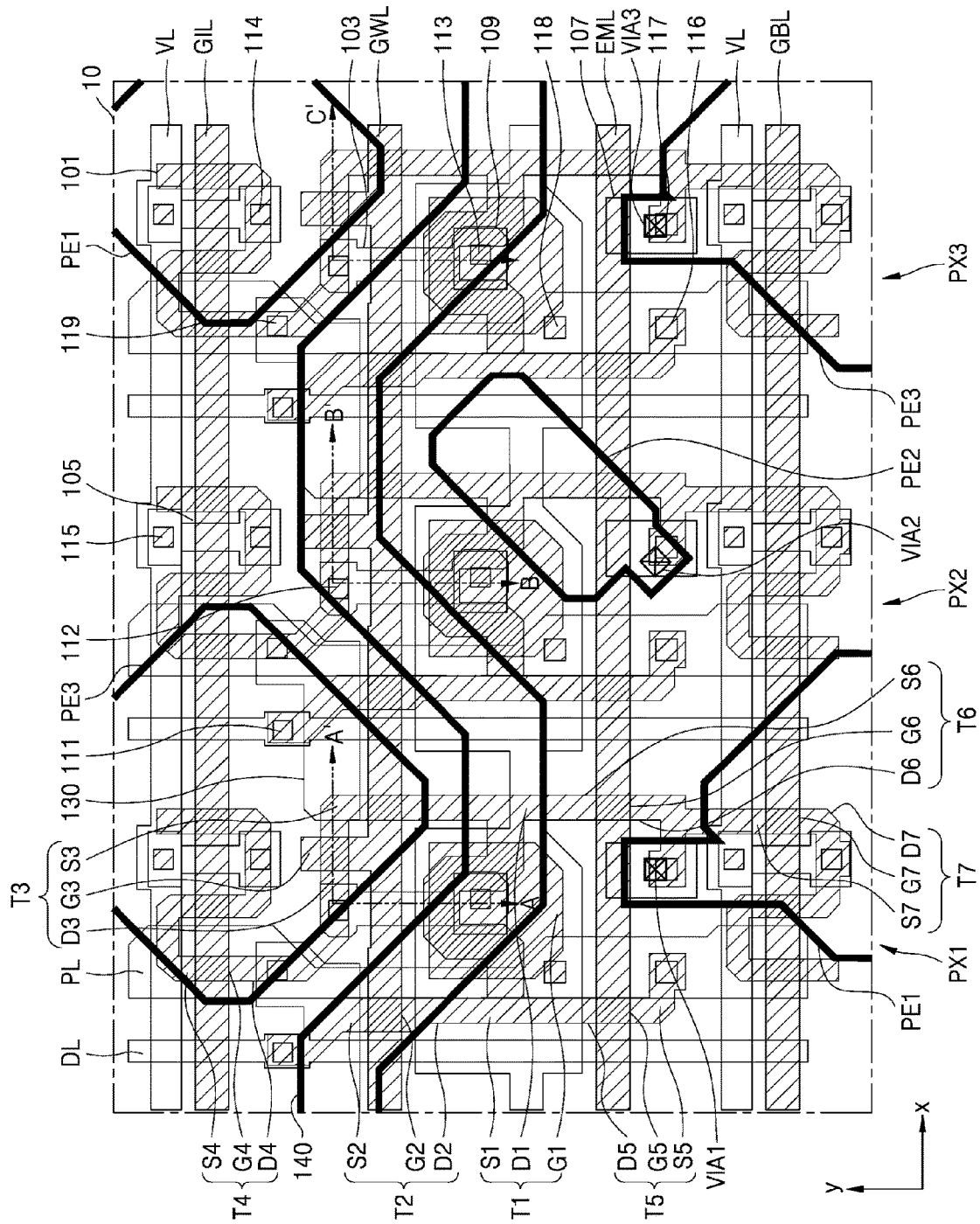
Figure 9:
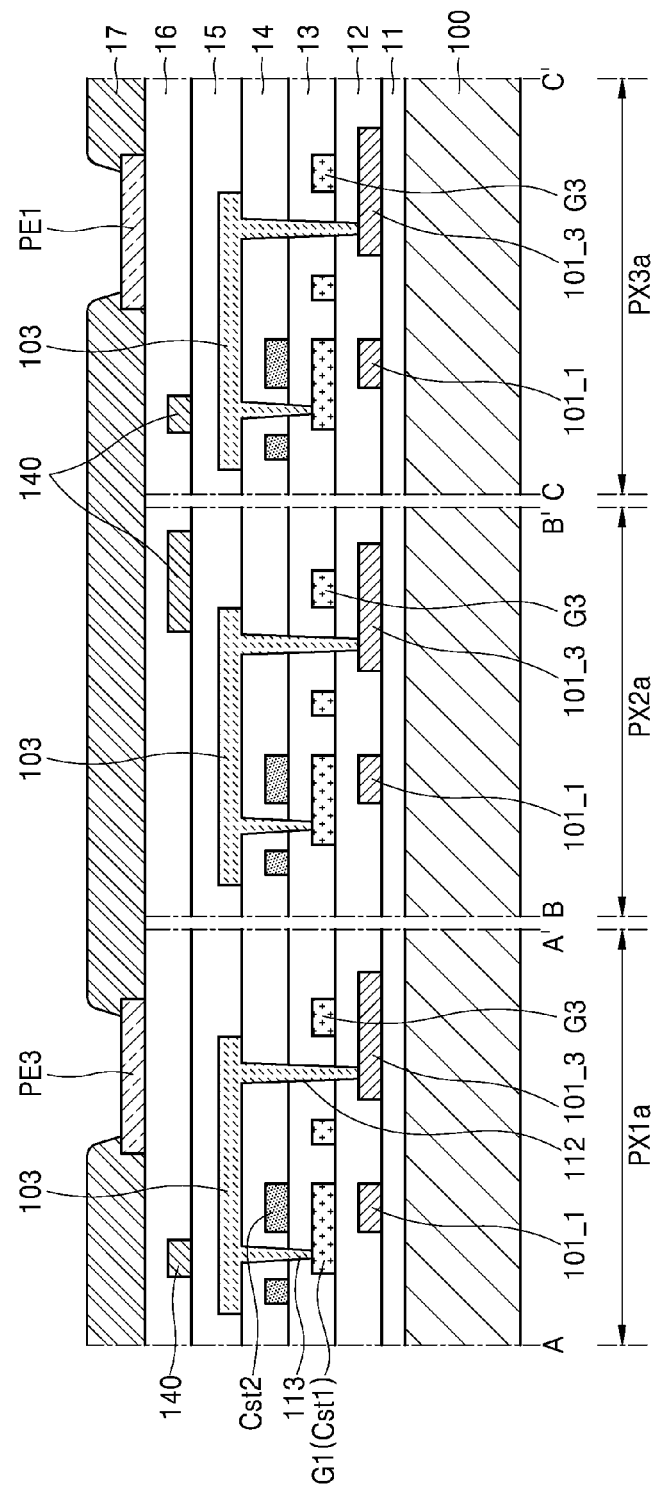

FIGS. 7 to 9 are schematic plan views and a schematic cross-sectional view each illustrating a shielding member according to an embodiment.

Referring to FIGS. 7 and 8, the display device 1 according to an embodiment may include a second shielding member 140 arranged in each row. The second shielding member 140 may extend in the first direction along respective portions of edges of first, second, and third pixel electrodes PE1, PE2, and PE3 so as not to overlap the first, second, and third pixel electrodes PE1, PE2, and PE3, and may be positioned over or below each row.

In a row, a first pixel region PX1$a$, a second pixel region PX2$a$ adjacent to the first pixel region PX1$a$, a third pixel region PX3$a$ adjacent to the second pixel region PX2$a$, and a fourth pixel region PX4$a$ (not shown) adjacent to the third pixel region PX3$a$ may be repeated in the first direction, and a first pixel PX1, a second pixel PX2, a third pixel PX3, and a second pixel PX2 may be repeated in the first to fourth pixel regions PX1$a$ to PX4$a$. The first pixel region PX1$a$ may be a red pixel region where the red pixel is arranged, the second pixel region PX2$a$ and the fourth pixel region PX4$a$ may be blue or green pixel regions where the blue pixel or the green pixel is arranged, and the third pixel region PX3$a$ may be green or blue pixel regions where the green pixel or the blue pixel is arranged.

FIG. 8 illustrates an example in which, in a row, a first pixel circuit of a first pixel PX1 is arranged in the first pixel region PX1$a$, a second pixel circuit of a second pixel PX2 is arranged in the second pixel region PX2$a$, and a third pixel circuit of a third pixel PX3 is arranged in the third pixel region PX3$a$. Although not shown in FIG. 8, a second pixel circuit of a second pixel PX2 may be arranged in the fourth pixel region PX4$a$.

The first pixel PX1 may include the first pixel circuit and a first organic light-emitting diode electrically connected to the first pixel circuit. The second pixel PX2 may include the second pixel circuit and a second organic light-emitting diode electrically connected to the second pixel circuit. The third pixel PX3 may include the third pixel circuit and a third organic light-emitting diode electrically connected to the third pixel circuit.

Each of the first to third pixel circuits of the first to third pixels PX1 through PX3 may be electrically connected to lines each extending in the first direction and lines each extending in the second direction intersecting the first direction. Each of the first scan line GIL, the second scan line GWL, the third scan line GBL, the initializing voltage line VL, and the light-emission control line EML may extend in the first direction. Each of the data line DL and the driving voltage line PL may extend in the second direction.

Each of the first to seventh transistors T1 to T7 of each of the first to third pixel circuits may be implemented as a thin-film transistor including a semiconductor layer, which includes a source region, a drain region, and a channel region between the source region and the drain region, and a gate electrode arranged at a position corresponding to that of the channel region and insulated from the semiconductor layer. Because the first to third pixel circuits are the same, they will now be described as a pixel PX and a pixel circuit.

Referring to FIGS. 8 and 9, a buffer layer 11 may be arranged over the substrate 100, and respective semiconductor layers 101 of the first to seventh transistors T1 to T7 may be arranged over the buffer layer 11. The buffer layer 11 may be omitted. FIG. 9 illustrates a portion of the first transistor T1 and a portion of the third transistor T3.

The semiconductor layers 101 may include polysilicon, for example. The first to seventh transistors T1 to T7 may be formed along the semiconductor layers 101. The respective semiconductor layers of the first to seventh transistors T1 to T7 may be arranged on a same layer, may be electrically connected to one another, and may be bent in various shapes. The respective semiconductor layers 101 of the first to seventh transistors T1 to T7 may include a channel region not doped with impurities and a source region and a drain region each doped with impurities. The impurities may vary depending on the type of transistor and may be N- or P-type impurities. The respective semiconductor layers 101 of the first to seventh transistors T1 to T7 are indicated by reference numerals 101_1 through 101_7, respectively (101_1 and 101_3 are shown while 101_2 and 101_4 to 101_7 are not shown in FIG. 9). The first electrode of each transistor of FIG. 5 may correspond to one of a source region and a drain region, and the second electrode thereof may correspond to the other. For convenience of explanation, the first electrode and the second electrode of the transistor are described as a source region Si and a drain region Dj, respectively (where i and j are natural numbers between 1 and 7).

A first insulating layer 12 may be arranged over the semiconductor layer 101, and the gate electrodes G1 to G7 of the first to seventh transistors T1 to T7 may be arranged over the first insulating layer 12. The first scan line GIL, the second scan line GWL, the third scan line GBL, and the light-emission control line EML and the gate electrodes G1 to G7 of the first to seventh transistors T1 to T7 may be arranged on a same layer and may extend in the first direction.

The first transistor T1 may include the gate electrode G1 and a semiconductor layer 101_1 including a source region S1, a drain region D1, and a channel region between the source region S1 and the drain region D1. The gate electrode G1 of the first transistor T1 may overlap the channel region in a plan view. Because the semiconductor layer 101_1 of the first transistor T1 may form a long channel region by having a curve between the source region S1 and the drain region D1, a gate voltage applied to the gate electrode G1 may have a wide driving range. The semiconductor layer 101_1 of the first transistor T1 may have various shapes such as "⊏," "⊒," "S," "M," and "W."

The second transistor T2 may include the gate electrode G2 and a semiconductor layer 101_2 including a source region S2, a drain region D2, and a channel region between the source region S2 and the drain region D2. The gate electrode G2 of the second transistor T2 may overlap the channel region in a plan view. The source region S2 of the second transistor T2 may be electrically connected to the data line DL via a contact hole 111 of the first insulating layer 12, a second insulating layer 13, and a third insulating layer 14. The drain region D2 of the second transistor T2 may be electrically connected to the source region S1 of the first transistor T1.

The third transistor T3 may include the gate electrode G3 and a semiconductor layer 101_3 including a source region S3, a drain region D3, and a channel region between the source region S3 and the drain region D3. The gate electrode G3 of the third transistor T3 may overlap the channel region in a plan view and may be formed by a portion of the second scan line GWL. The source region S3 of the third transistor T3 may be electrically connected to the drain region D1 of the first transistor T1, and the drain region D3 may be electrically connected to the gate electrode G1 of the first transistor T1 by a connection electrode 103. The connection electrode 103 may electrically connect the drain region D3 of the third transistor T3 to the gate electrode G1 of the first transistor T1 through a contact hole 112 of the first to third insulating layers 12 to 14 exposing the drain region D3 of the third transistor T3 and a contact hole 113 of the second and third insulating layers 13 and 14 exposing the gate electrode G1 of the first transistor T1.

The fourth transistor T4 may include the gate electrode G4 and a semiconductor layer 101_4 including a source region S4, a drain region D4, and a channel region between the source region S4 and the drain region D4. The gate electrode G4 of the fourth transistor T4 may overlap the channel region in a plan view and may be formed by a portion of the first scan line GIL. The source region S4 of the fourth transistor T4 may be electrically connected to the initializing voltage line VL by a connection electrode 105, and the drain region D4 may be electrically connected to the drain region D3 of the third transistor T3 and the gate electrode G1 of the first transistor T1. The connection electrode 105 may electrically connect the source region S4 of the fourth transistor T4 to the initializing voltage line VL through a contact hole 114 of the first to third insulating layers 12 to 14 exposing the source region S4 of the fourth transistor T4 and a contact hole 115 of the third insulating layer 14 exposing the initializing voltage line VL. The initializing voltage line VL and the second electrode Cst2 of the capacitor Cst may be arranged on a same layer.

The fifth transistor T5 may include the gate electrode G5 and the semiconductor layer 101_5 including a source region S5, a drain region D5, and a channel region between the source region S5 and the drain region D5. The gate electrode G5 of the fifth transistor T5 may overlap the channel region in a plan view and may be formed by a portion of the light-emission control line EML. The source region S5 of the fifth transistor T5 may be electrically connected to the driving voltage line PL through a contact hole 116 of the first to third insulating layers 12 to 14 exposing a portion of the source region S5, and the drain region D5 may be electrically connected to the first electrode S1 of the first transistor T1.

The sixth transistor T6 may include the gate electrode G6 and the semiconductor layer 101_6 including a source region S6, a drain region D6, and a channel region between the source region S6 and the drain region D6. The gate electrode G6 of the sixth transistor T6 may overlap the channel region in a plan view and may be formed by a portion of the light-emission control line EML. The source region S6 of the sixth transistor T6 may be electrically connected to the drain region D1 of the first transistor T1, and the drain region D6 may be electrically connected to the pixel electrode of the organic light-emitting diode OLED. The drain region D6 of the sixth transistor T6 may be electrically connected to a connection electrode 107 provided on the third insulating layer 14 through a contact hole 117 of the first to third insulating layers 12 to 14 exposing a portion of the drain region D6. The pixel electrode may be electrically connected to the drain region D6 of the sixth transistor T6 by being electrically connected to the connection electrode 107 through a via hole of fourth and fifth insulating layers 15 and 16 over the connection electrode 107 electrically connected to the drain region D6 of the sixth transistor T6.

The seventh transistor T7 may include the gate electrode G7 and the semiconductor layer 101_7 including a source region S7, a drain region D7, and a channel region between the source region S7 and the drain region D7. The gate electrode G7 of the seventh transistor T7 may overlap the channel region in a plan view and may be formed by a portion of the third scan line GBL. The drain region D7 of the seventh transistor T7 may be electrically connected to the source region S4 of the fourth transistor T4, and the source region S7 may be electrically connected to the drain region D6 of the sixth transistor T6.

The second insulating layer 13 may be arranged over the gate electrodes G1 to G7 of the first to seventh transistors T1 to T7. The second electrode Cst2 of the capacitor Cst may be arranged over the second insulating layer 13. The initializing voltage line VL and a first shielding member 130 and the second electrode Cst2 of the capacitor Cst may be arranged on a same layer. The first shielding member 130 and the second electrode Cst2 of the capacitor Cst may include a same material. The first shielding member 130 may include a metal, for example, a light-shielding metal, that blocks light.

The first electrode Cst1, which is a lower electrode of the capacitor Cst, may be the gate electrode G1 of the first transistor T1. In other words, the first electrode Cst1 of the capacitor Cst and the gate electrode G1 of the first transistor T1 may be understood as being integral with each other. The first electrode Cst1 of the capacitor Cst may be formed in an island shape. The first electrode Cst1 and the first scan line GIL, the second scan line GWL, the third scan line GBL, and the light-emission control line EML may include a same material and be formed on a same layer. The first electrode Cst1 of the capacitor Cst may have a polygonal shape such as a rectangular shape, but embodiments are not limited thereto. The first electrode Cst1 of the capacitor Cst may have any of various other shapes.

The second electrode Cst2, which is an upper electrode of the capacitor Cst, may be electrically connected to second electrodes Cst2 of adjacent pixels in the first direction, for example, second electrodes Cst2 of pixels in a same row. The second electrode Cst2 of the capacitor Cst may overlap the first electrode Cst1 to cover the entire first electrode Cst1 and may vertically overlap the first transistor T1 in a plan view and a cross-sectional view. The second insulating layer 13 between the first electrode Cst1 and the second electrode Cst2 of the capacitor Cst may function as a dielectric layer. The second electrode Cst2 of the capacitor Cst may include an opening 109 at a position corresponding to that of the contact hole 113 exposing a portion of the first electrode Cst1.

The third insulating layer 14 may be arranged over the second electrode Cst2 of the capacitor Cst. The data line DL and the driving voltage line PL may be arranged on the third insulating layer 14 and may each extend in the second direction. The driving voltage line PL may partially overlap the second electrode Cst2 of the capacitor Cst.

The second electrode Cst2 of the capacitor Cst may be electrically connected to the driving voltage line PL through a contact hole 118 of the third insulating layer 14 exposing a portion of the second electrode Cst2. Accordingly, the driving voltage line PL may function as a power line extending in the second direction, and the second electrode Cst2 of the capacitor Cst may function as a power line extending in the first direction, and thus, the driving voltage line PL may entirely have a mesh structure. The driving voltage line PL may be electrically connected to the source region S5 of the fifth transistor T5.

The first shielding member 130 may be electrically connected to the driving voltage line PL through a contact hole 119 of the third insulating layer 14 exposing a portion of the first shielding member 130. The first shielding member 130 may at least partially overlap the second transistor T2 in the first direction. The first shielding member 130 may be an electrode pattern that overlaps a portion of the data line DL and at least one of the source region S2 and the drain region D2 of the second transistor T2. The first shielding member 130 may be arranged on a layer between the second transistor T2 and the data line DL. The first shielding member 130 may be independently included for each pixel PX. The first shielding member 130 may shield the second transistor T2 from an influence of externally incident light and/or other neighboring electrical signals. In other words, the first shielding member 130 may improve operational characteristics of the pixel circuit.

According to the above-described embodiment, the first shielding member 130 may be electrically connected to the driving voltage line PL. However, embodiments are not limited thereto. The first shielding member 130 may be electrically connected to the initializing voltage line VL and may receive the initializing voltage Vint, which is a constant voltage. Alternatively, the first shielding member 130 may receive the second power supply voltage ELVSS, which is a constant voltage. Alternatively, the first shielding member 130 may not receive a voltage and may be floating.

The connection electrodes 103, 105, and 107 and the data line DL and the driving voltage line PL may be arranged on a same layer. The connection electrodes 103, 105, and 107 may fill the contact holes 112 to 115 and 117 formed in at least one of the first to third insulating layers 12 to 14, and the connection electrodes 103, 105, and 107 may electrically contact electrode layers therebelow.

The fourth insulating layer 15 may be arranged over the first to third pixel circuits.

The second shielding member 140 may be arranged over the fourth insulating layer 15. The second shielding member 140 may have a straight line shape or a zigzag shape extending in the second direction according to an arrangement of the first to third pixel electrodes PE1 to PE3. The second shielding member 140 and the data line DL and the driving voltage line PL may include a same material. The second shielding member 140 may include a metal that blocks light, for example, a light-shielding metal. For example, the second shielding member 140 may include molybdenum (Mo), aluminum (Al), copper (Cu), and/or titanium (Ti) and may have a multi-layered or single-layered structure including the aforementioned materials. In an embodiment, the second shielding member 140 may be formed as a multi-layer of Ti/Al/Ti.

The second shielding member 140 may at least partially overlap the third transistor T3 of at least one of the first to third pixel circuits in the first direction. The second shielding member 140 may overlap at least one of the source region S3 and the drain region D3 of the third transistor T3. In the embodiment of FIG. 8, the second shielding member 140 may overlap at least one of the source region S3 and the drain region D3 of the third transistor T3 of the second pixel PX2.

The second shielding members 140 may be spaced apart from each other and may be independently included for each row. The second shielding members 140 may be floating, or may be electrically connected to a constant voltage line and receive a constant voltage. The constant voltage may be one of the initializing voltage Vint, the first power supply voltage ELVDD, and the second power supply voltage ELVSS. The second shielding member 140 may shield the third transistor T3 from an influence of externally incident light and/or other neighboring electrical signals. In other words, the second shielding member 140 may improve operational characteristics of the pixel circuit.

Although not shown in the drawings, a connection electrode electrically connected to the pixel electrode of the organic light-emitting diode OLED and the drain region D6 of the sixth transistor T6 may be further arranged on a layer identical to that of the second shielding member 140.

The fifth insulating layer 16 may be arranged over the second shielding member 140.

The first to third pixel electrodes PE1 to PE3 electrically connected to the first to third pixel circuits, respectively, may be arranged over the fifth insulating layer 16.

The first pixel electrode PE1 electrically connected to the first pixel circuit of the first pixel PX1 may be arranged over the first pixel circuit. The second pixel electrode PE2 electrically connected to the second pixel circuit of the second pixel PX2 may be arranged over the second pixel circuit. The third pixel electrode PE3 electrically connected to the third pixel circuit of the third pixel PX3 may be arranged over the third pixel circuit.

The first pixel electrode PE1 may at least partially overlap the first pixel circuit to which the first pixel electrode PE1 is electrically connected, and the third pixel circuit of a third pixel PX3 that is arranged in a same column and in an adjacent row. The third pixel electrode PE3 may at least partially overlap the third pixel circuit to which the third pixel electrode PE3 is electrically connected, and the first pixel circuit of a first pixel PX1 that is arranged in a same column and in an adjacent row. At least a portion of the second pixel electrode PE2 may overlap the second pixel circuit to which the second pixel electrode PE2 is electrically connected.

The first pixel electrode PE1 and the second pixel electrode PE2 may be arranged adjacent to each other in a diagonal direction in a plan view. The third pixel electrode PE3 and the second pixel electrode PE2 may be arranged adjacent to each other in a diagonal direction in a plan view.

The first pixel electrode PE1, the second pixel electrode PE2, the third pixel electrode PE3, and the second pixel electrode PE2 may be repeated in the first direction. The first pixel electrode PE1 and the third pixel electrode PE3 may be repeated in the first direction in a first column. The second pixel electrode PE2 may be repeated in the second direction in a second column adjacent to the first column. The third pixel electrode PE3 and the first pixel electrode PE1 may be repeated in the second direction in a third column adjacent to the second column. The second pixel electrode PE2 may be repeated in the second direction in a fourth column adjacent to the third column.

The first pixel electrode PE1 may electrically contact the connection electrode 107 through a first via hole VIA1 of the fourth and fifth insulating layers 15 and 16. Accordingly, the first pixel electrode PE1 may be electrically connected to the drain region D6 of the sixth transistor T6 of the first pixel PX1 through the first via hole VIA1. The first pixel electrode PE1 may overlap at least a portion of the semiconductor layer 101_3 of the third transistor T3 of the third pixel PX3 that is arranged in an adjacent row in the second direction, for example, at least one of the source region and the drain region of the semiconductor layer 101_3.

The second pixel electrode PE2 may electrically contact the connection electrode 107 through a second via hole VIA2 of the fourth and fifth insulating layers 15 and 16. Accordingly, the second pixel electrode PE2 may be electrically connected to the drain region D6 of the sixth transistor T6 of the second pixel PX2 through the second via hole VIA2.

The third pixel electrode PE3 may electrically contact the connection electrode 107 through a third via hole VIA3 of the fourth and fifth insulating layers 15 and 16. Accordingly, the third pixel electrode PE3 may be electrically connected to the drain region D6 of the sixth transistor T6 of the third pixel PX3. The third pixel electrode PE3 may overlap at least a portion of the semiconductor layer 101_3 of the third transistor T3 of the first pixel PX1 that is arranged in an adjacent row in the second direction, for example, at least one of the source region and the drain region of the semiconductor layer 101_3.

The first pixel electrode PE1 may include a first region 123*a* and a second region 125*a* extending from the first region 123*a*. A first emission layer 121*a* may be arranged over the first region 123*a*. The second area 125*a* may cover the first via hole VIA1. An edge of the first region 123*a* may be covered with a sixth insulating layer 17. The second region 125*a* may be covered (or overlapped) with the sixth insulating layer 17. The first via hole VIA1 may be formed in at least one insulating layer between the first pixel circuit and the first pixel electrode PE1, and the first pixel electrode PE1 may be electrically connected to the first pixel circuit by contacting an electrode (for example, the drain region D6 of the sixth transistor T6 of FIG. 8) of the first pixel circuit through the first via hole VIA1.

The second pixel electrode PE2 may include a first region 123*b* and a second region 125*b* extending from the first region 123*b*. A second emission layer 121*b* may be arranged over the first region 123*b*. The second region 125*b* may cover (or overlap) the second via hole VIA2. An edge of the first region 123*b* may be covered with the sixth insulating layer 17. The second region 125*b* may be covered with the sixth insulating layer 17. The second via hole VIA2 may be formed in at least one insulating layer between the second pixel circuit and the second pixel electrode PE2, and the second pixel electrode PE2 may be electrically connected to the second pixel circuit by contacting an electrode (for example, the drain region D6 of the sixth transistor T6 of FIG. 8) of the second pixel circuit through the second via hole VIA2.

The third pixel electrode PE3 may include a first region 123*c* and a second region 125*c* extending from the first region 123*c*. A third emission layer 121*c* may be arranged over the first region 123*c*. The second region 125*c* may cover the third via hole VIA3. An edge of the first region 123*c* may be covered with the sixth insulating layer 17. The second region 125*c* may be covered with the sixth insulating layer 17. The third via hole VIA3 may be formed in at least one insulating layer between the third pixel circuit and the third pixel electrode PE3, and the third pixel electrode PE3 may be electrically connected to the third pixel circuit by contacting an electrode (for example, the drain region D6 of the sixth transistor T6 of FIG. 8) of the third pixel circuit through the third via hole VIA3.

The first via hole VIA1, the second via hole VIA2, and the third via hole VIA3 may be arranged along a virtual third straight line IL3.

In the embodiment of FIGS. 7 to 9, at least a portion of the semiconductor layer of the third transistor T3 of the first pixel PX1 may be shielded by the third pixel electrode PE3 of the third pixel PX3 that is arranged in a row adjacent to that of the first pixel PX1. At least a portion of the semiconductor layer of the third transistor T3 of the third pixel PX3 may be shielded by the first pixel electrode PE1 of the first pixel PX1 that is arranged in a row adjacent to that of the third pixel PX3. At least a portion of the semiconductor layer of the third transistor T3 of the second pixel PX2 may be shielded by the second shielding member 140.

The first region 123a of the first pixel electrode PE1 of a first pixel PX1 arranged in a row may overlap at least one of the source region S3 and the drain region D3 of the third transistor T3 of a third pixel PX3 that is arranged in a neighboring row adjacent to the row in the second direction. The first region 123c of the third pixel electrode PE3 of a third pixel PX3 may overlap at least one of the source region S3 and the drain region D3 of the third transistor T3 of a first pixel PX1 that is arranged in a neighboring row adjacent to that of the third pixel PX3 in the second direction. The second shielding member 140 may overlap at least one of the source region S3 and the drain region D3 of the third transistor T3 of the second pixel PX2.

The first shielding member 130 may overlap a portion of the semiconductor layer of the second transistor T2 of each of the first to third pixels PX1 to PX3, for example, at least one of the source region and the drain region of the semiconductor layer.

Figure 10:
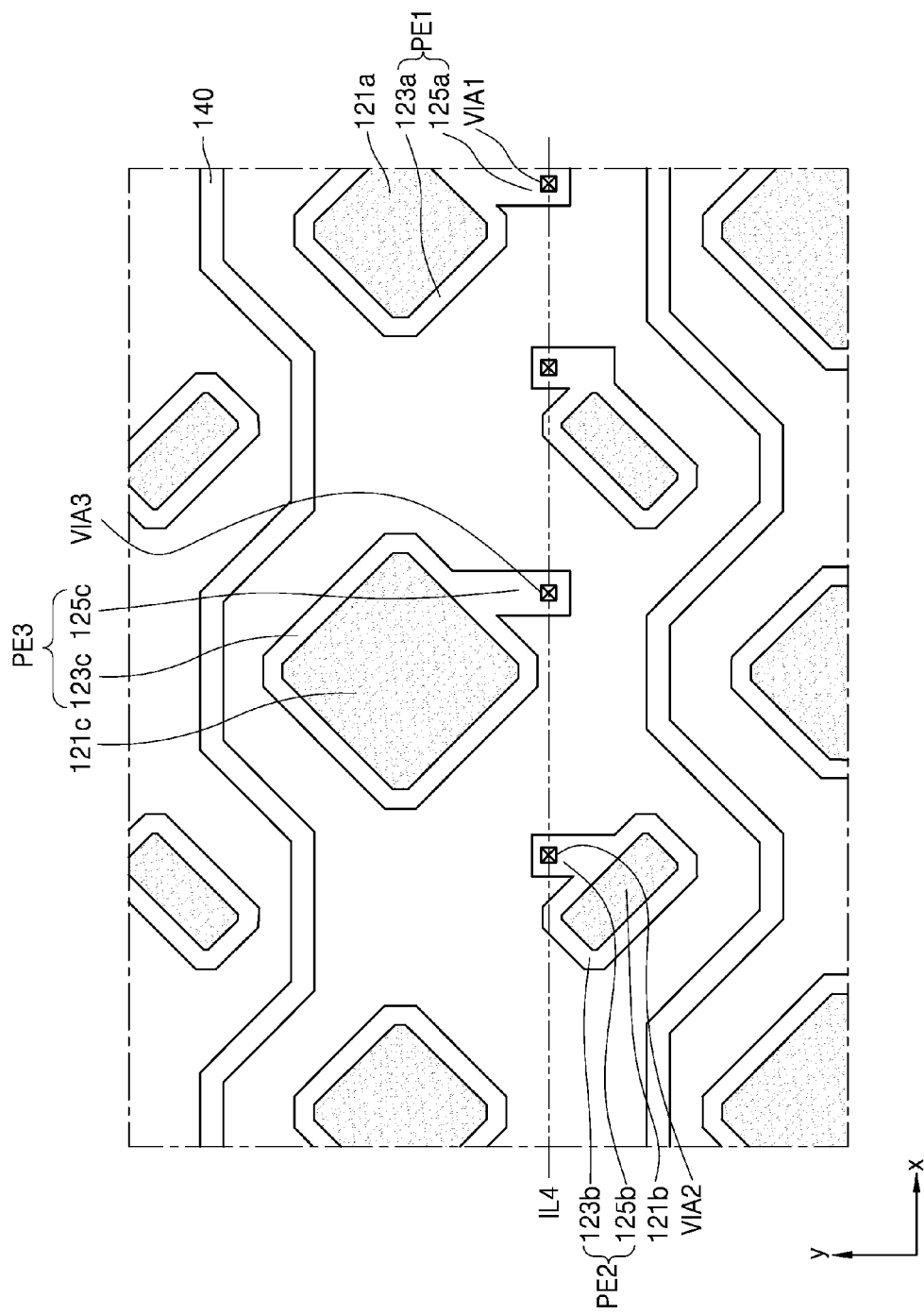
FIGS. 10 through 12 are plan views and a cross-sectional view each illustrating a shielding member according to another embodiment of the disclosure.
Figure 11:
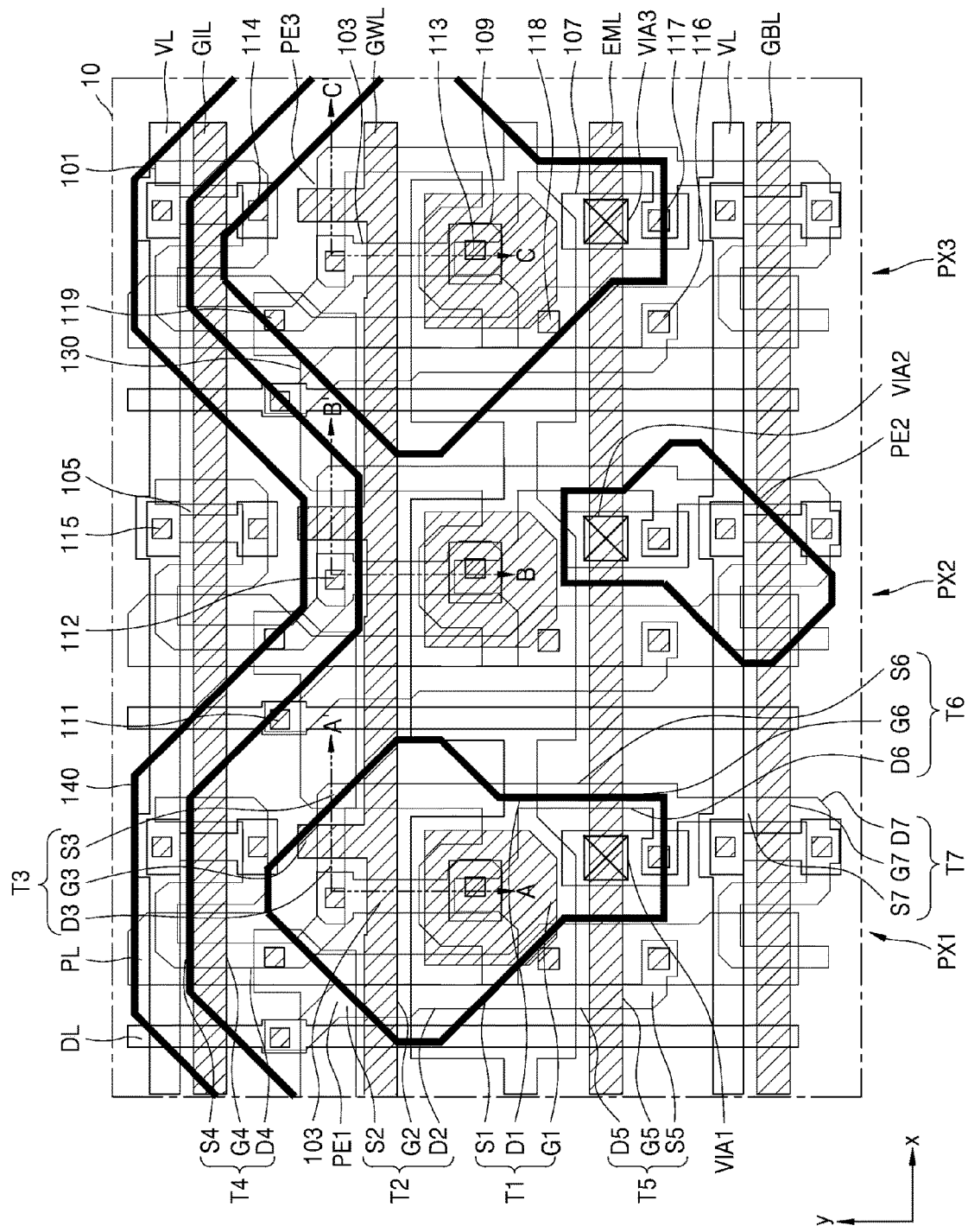
Figure 12:
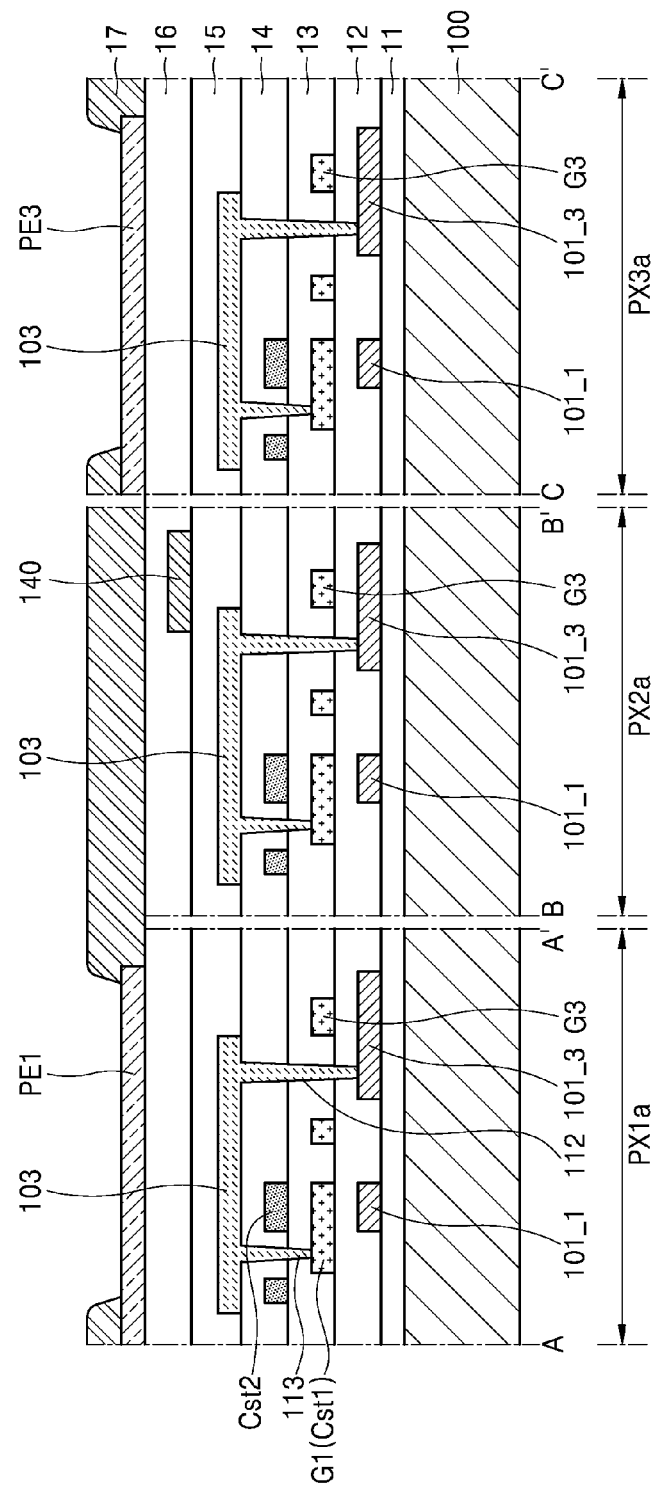

FIGS. 10 to 12 are schematic plan views and a schematic cross-sectional view each illustrating a shielding member according to an embodiment.

The embodiments of FIGS. 10 to 12 may be different from those of FIGS. 7 to 9 at least in terms of an arrangement of the pixel electrode PE and the second shielding member 140, and may be identical those of FIGS. 7 to 9 in terms of the other elements. Descriptions of components of the embodiments of FIGS. 10 to 12 that are identical to those of the embodiments of FIGS. 7 to 9 will be omitted, and differences therebetween will now be mainly described.

Referring to FIGS. 10 and 11, the display device 1 according to an embodiment may include the second shielding member 140 arranged in each row. The second shielding member 140 may extend in the first direction along respective portions of edges of first, second, and third pixel electrodes PE1, PE2, and PE3 so as not to overlap the first, second, and third pixel electrodes PE1, PE2, and PE3, and may be positioned over or below each row.

In each row, in the first direction, the first pixel circuit of the first pixel PX1 may be arranged in the first pixel region PX1a, the second pixel circuit of the second pixel PX2 may be arranged in the second pixel region PX2a adjacent to the first pixel region PX1a, and the third pixel circuit of the third pixel PX3 may be arranged in the third pixel region PX3a adjacent to the second pixel region PX2a. Although not shown in the drawings, the second pixel circuit of the second pixel PX2 may be arranged in the fourth pixel region PX4a adjacent to the third pixel region PX3a.

At least a portion of the first pixel electrode PE1 may overlap the first pixel circuit to which the first pixel electrode PE1 is electrically connected. At least a portion of the second pixel electrode PE2 may overlap the second pixel circuit to which the second pixel electrode PE2 is electrically connected. At least a portion of the third pixel electrode PE3 may overlap the third pixel circuit to which the third pixel electrode PE3 is electrically connected.

The fourth insulating layer 15 may be arranged over the first to third pixel circuits, and the second shielding member 140 may be arranged over the fourth insulating layer 15. The second shielding member 140 may have a straight line shape or a zigzag shape according to an arrangement of the first to third pixel electrodes PE1 to PE3. In the embodiment of FIG. 11, the second shielding member 140 may overlap at least one of the source region S3 and the drain region D3 of the third transistor T3 of the second pixel PX2. The second shielding members 140 may be spaced apart from each other and may be independently included for each row. The second shielding members 140 may be floating, or may be electrically connected to a constant voltage line and receive a constant voltage. The constant voltage may be one of the initializing voltage Vint, the first power supply voltage ELVDD, and the second power supply voltage ELVSS.

The fifth insulating layer 16 may be arranged over the second shielding member 140, and the first to third pixel electrodes PE1 to PE3 electrically connected to the first to third pixel circuits, respectively, may be arranged over the fifth insulating layer 16.

The first pixel electrode PE1 may overlap at least a portion of the semiconductor layer 101_3 of the third transistor T3 of the first pixel circuit to which the first pixel electrode PE1 is electrically connected, for example, at least one of the source region and the drain region of the semiconductor layer 101_3. The first pixel electrode PE1 may include a first region 123a and a second region 125a extending from the first region 123a.

The second pixel electrode PE2 may include a first region 123b and a second region 125b extending from the first region 123b.

The third pixel electrode PE3 may overlap at least a portion of the semiconductor layer 101_3 of the third transistor T3 of the third pixel circuit to which the third pixel electrode PE3 is electrically connected, for example, at least one of the source region and the drain region of the semiconductor layer 101_3. The third pixel electrode PE3 may include a first region 123c and a second region 125c extending from the first region 123c.

The first via hole VIA1, the second via hole VIA2, and the third via hole VIA3 may be arranged along a virtual fourth straight line IL4.

In the embodiments of FIGS. 10 to 12, at least a portion of the semiconductor layer of the third transistor T3 of the first pixel PX1 may be shielded by the first pixel electrode PE1 of the first pixel PX1. At least a portion of the semiconductor layer of the third transistor T3 of the third pixel PX3 may be shielded by the third pixel electrode PE3 of the third pixel PX3. At least a portion of the semiconductor layer of the third transistor T3 of the second pixel PX2 may be shielded by the second shielding member 140.

In a row, the first region 123a of the first pixel electrode PE1 of a first pixel PX1 may overlap at least one of the source region S3 and the drain region D3 of the third transistor T3 of the first pixel circuit to which the first pixel electrode PE1 is electrically connected. The first region 123c of the third pixel electrode PE3 of the third pixel PX3 may overlap at least one of the source region S3 and the drain region D3 of the third transistor T3 of the third pixel circuit to which the third pixel electrode PE3 is electrically connected. The second shielding member 140 may overlap at least one of the source region S3 and the drain region D4 of the third transistor T3 of the second pixel PX2.

The first shielding member 130 may overlap a portion of the semiconductor layer of the second transistor T2 of each of the first to third pixels PX1 to PX3, for example, at least one of the source region and the drain region of the semiconductor layer.

Figure 13:
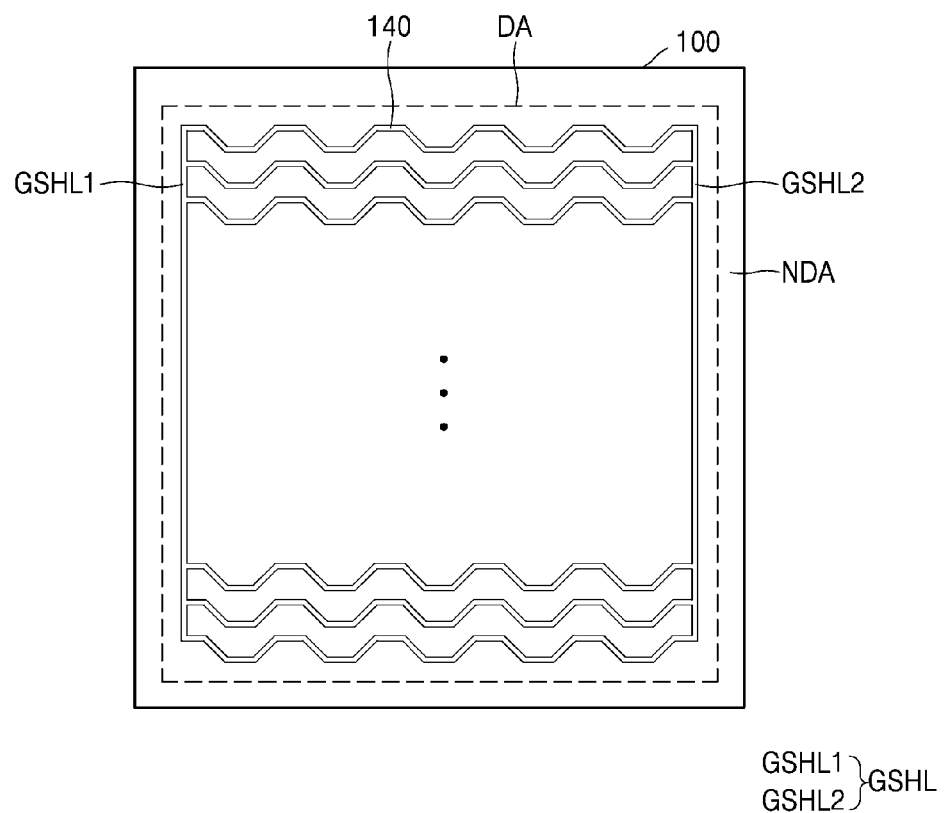
FIGS. 13 through 15 are views illustrating examples of a second shielding member according to another embodiment of the disclosure.
Figure 14:
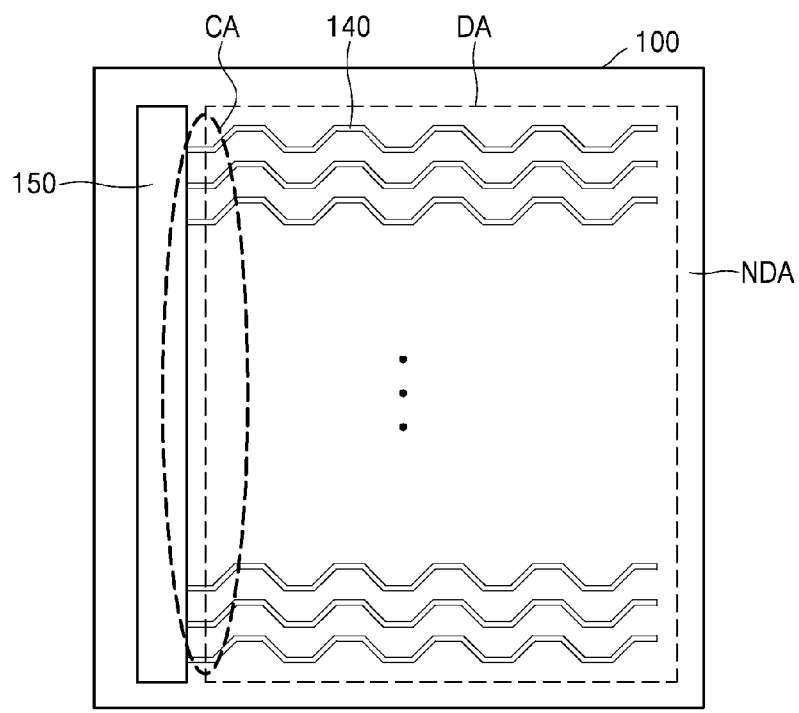
Figure 15:
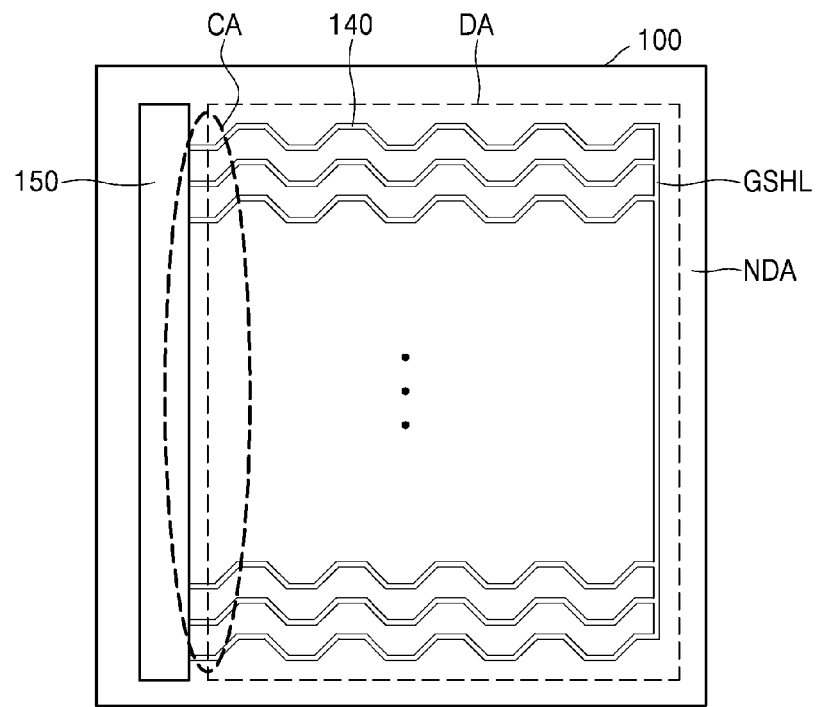

FIGS. 13 to 15 are schematic views illustrating examples of a second shielding member according to an embodiment. FIGS. 13 to 15 illustrate only the second shielding member 140 for convenience of explanation, and pixel circuits and pixel electrodes other than the second shielding member 140 are omitted.

Referring to FIG. 13, the second shielding member 140 may be arranged in each row to overlap the semiconductor layers of the respective third transistors T3 of the second pixels PX2, and the second shielding members 140 arranged in the rows may be electrically connected to one another by a common shield line GSHL. The common shield line GSHL may include a first common shield line GSHL1 connecting respective ends of the second shielding members 140 to each other and a second common shield line GSHL2 connecting respective other ends of the second shielding members 140 to each other. The common shield line GSHL may be integral with the second shielding members 140, or may be arranged on a separate layer from the second shielding members 140 and may be electrically connected to the second shielding members 140. The second shielding members 140 and the common shield line GSHL may be arranged within the display area DA.

In an embodiment, the second shielding members 140 and the common shield line GSHL may be in a floating state. In an embodiment, the second shielding members 140 and the common shield line GSHL may receive the initializing voltage Vint or the second power supply voltage ELVSS. By connecting the second shielding members 140, arranged in the rows, to the common shield line GSHL, even in case that one of the second shielding members 140 is shorted with a neighboring line, a potential difference between the second shielding members 140 may be removed, leading to reduction in a coupling difference between lines.

Referring to FIGS. 14 and 15, an end of the second shielding member 140 arranged in each row may be electrically connected to a second power supply voltage line 150 arranged in the non-display area NDA. Another end of the second shielding member 140 may be floating as shown in FIG. 14, or may be electrically connected to the common shield line GSHL as shown in FIG. 15.

The second shielding member 140 may receive the second power supply voltage ELVSS from the second power supply voltage line 150. The second power supply voltage line 150 may be electrically connected to the counter electrode of an organic light-emitting diode OLED. The second power supply voltage line 150 and one of the first electrode Cst1 of the capacitor Cst, the second electrode Cst2 of the capacitor Cst, and the data line DL in the display area DA may include a same material and may be arranged on a same layer.

The common shield line GSHL may be integral with the second shielding members 140. The common shield line GSHL and the second shielding members 140 may be arranged on a same layer, or may be arranged on different layers, and may be electrically connected to each other.

In the embodiments of FIGS. 14 and 15, a connection area CA electrically connecting the second shielding members 140 to the second power supply voltage line 150 may be positioned at the boundary between the display area DA and the non-display area NDA. Electrodes extending from respective ends of the second shielding members 140, electrodes protruding from the second power supply voltage line 150 and extending, or electrodes arranged on a different layer from the layer on which the second shielding members 140 and the second power supply voltage line 150 are arranged, and electrically connected to the second shielding members 140 and the second power supply voltage line 150, may be arranged in the connection area CA.

Figure 16:
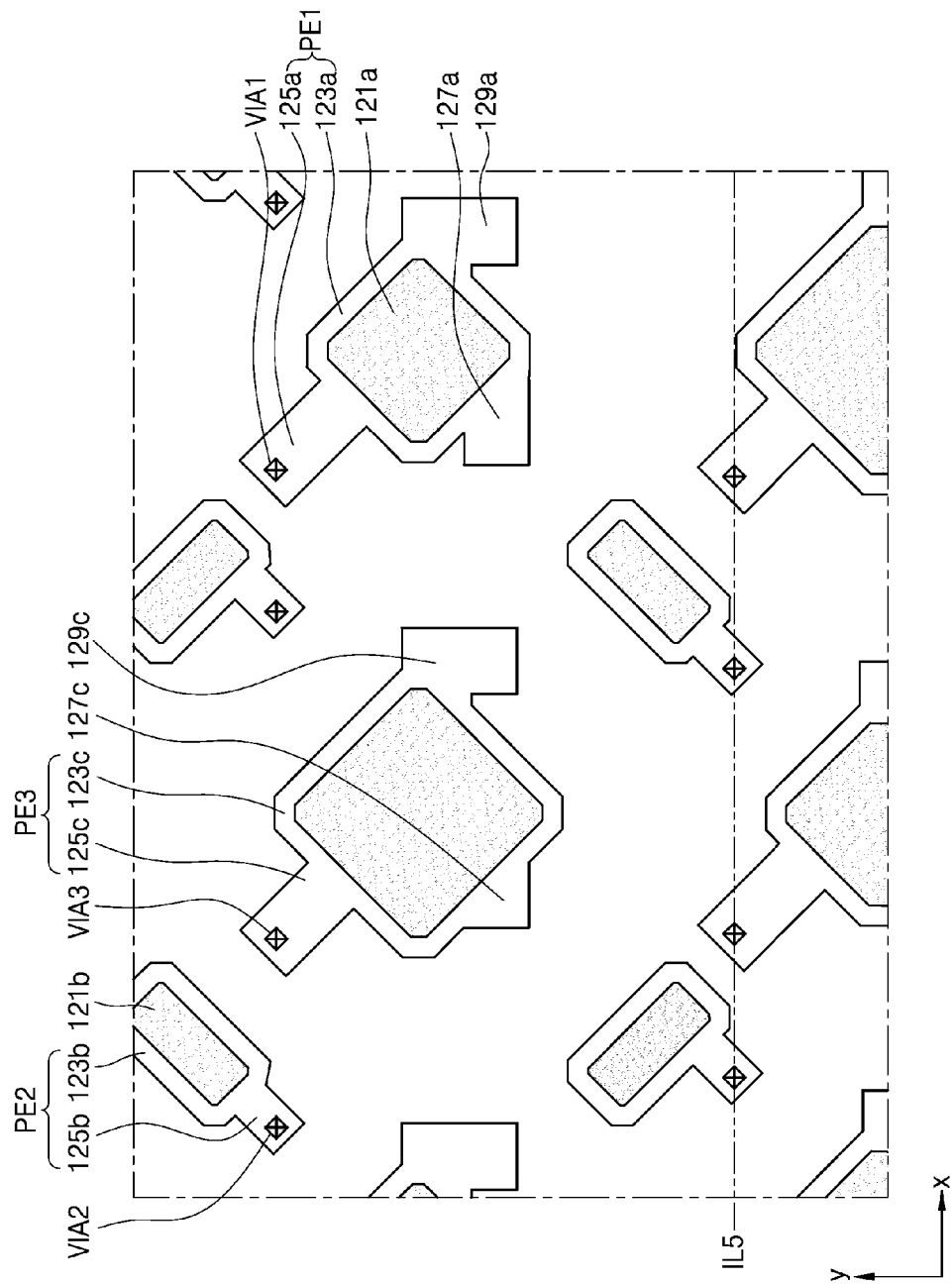
FIGS. 16 and 17 are plan views each illustrating a shielding member according to another embodiment of the disclosure.
Figure 17:
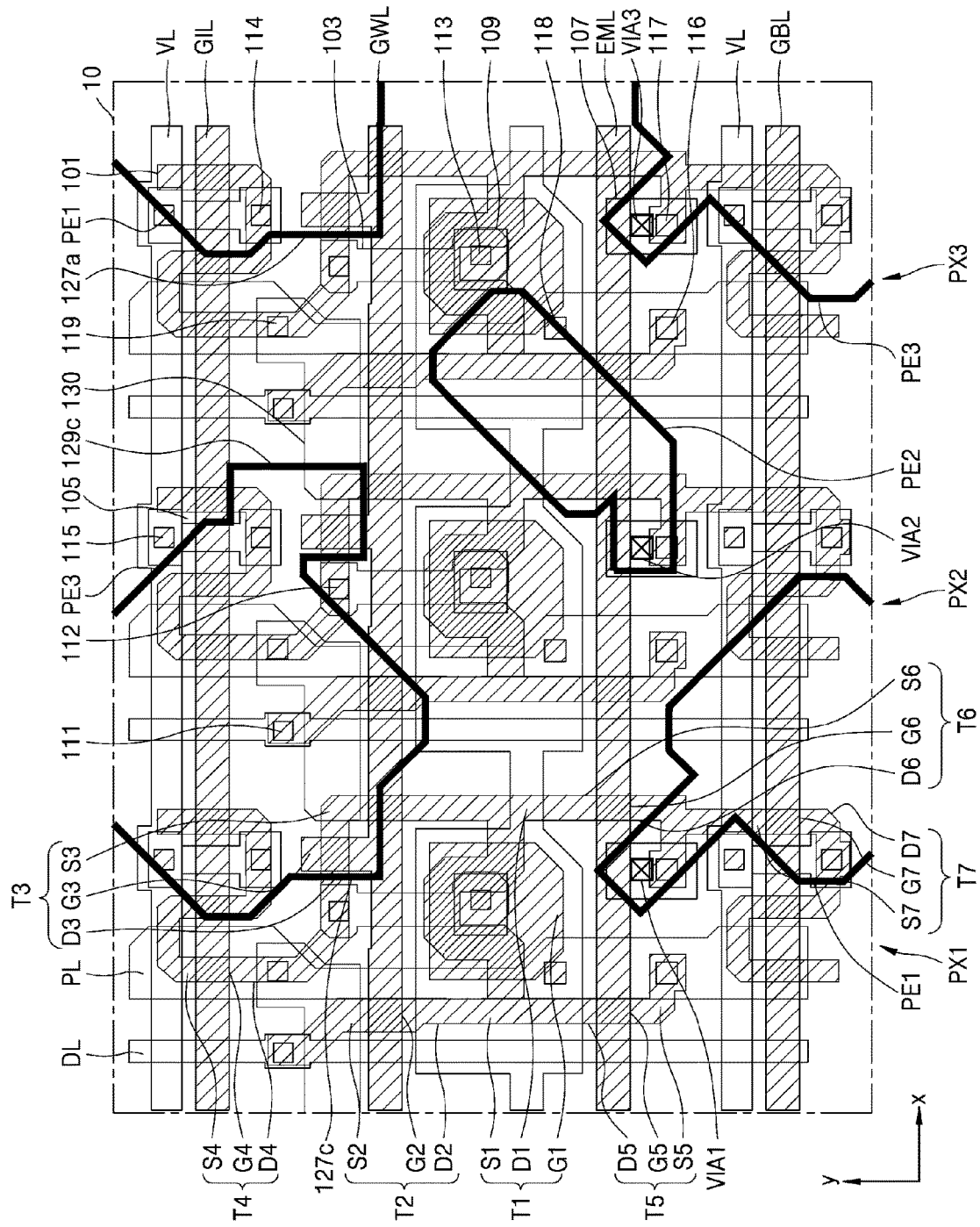

FIGS. 16 and 17 are schematic plan views each illustrating a shielding member according to an embodiment.

Referring to FIGS. 16 and 17, the display device 1 according to an embodiment may include a portion of a pixel electrode PE as a shielding member. Because an arrangement of the first to third pixel circuits of the first to third pixels PX1 to PX3 in the embodiments of FIGS. 16 and 17 is identical to that in the embodiments of FIGS. 8 and 9, descriptions of components in the embodiments of FIGS. 16 and 17 that are identical to those in the embodiments of FIGS. 7 to 9 will be omitted, and differences therebetween will be mainly described.

Referring to FIGS. 16 and 17, in each row, the first pixel circuit of the first pixel PX1 may be arranged in the first pixel region PX1a of the substrate 100, the second pixel circuit of the second pixel PX2 may be arranged in the second pixel region PX2a adjacent to the first pixel region PX1a of the substrate 100, and the third pixel circuit of the third pixel PX3 may be arranged in the third pixel region PX3a adjacent to the second pixel region PX2a of the substrate 100. Although not shown in FIGS. 16 and 17, the second pixel circuit of the second pixel PX2 may be arranged in the fourth pixel region PX4a adjacent to the third pixel region PX3a.

The fourth insulating layer 15 and the fifth insulating layer 16 may be arranged over the first to third pixel circuits. The first to third pixel electrodes PE1 to PE3 electrically connected to the first to third pixel circuits, respectively, may be arranged over the fifth insulating layer 16. The second shielding member 140 of FIGS. 7 to 9 may not be formed, and thus, the fifth insulating layer 16 may be omitted.

In a row, a first pixel electrode PE1 may at least partially overlap the first pixel circuit to which the first pixel electrode PE1 is electrically connected, the third pixel circuit of a third pixel PX3 which is arranged in a same column and an adjacent row in the second direction, and the second pixel circuit of a second pixel PX2 which is arranged in an adjacent column and an adjacent row in the second direction. A third pixel electrode PE3 may at least partially overlap the third pixel circuit to which the third pixel electrode PE3 is electrically connected, the first pixel circuit of a first pixel PX1 which is in a same column and an adjacent row in the second direction, and the second pixel circuit of a second pixel PX2 which is arranged in an adjacent column and an adjacent row in the second direction. A second pixel electrode PE2 may at least partially overlap the second pixel circuit to which the second pixel electrode PE2 is electrically connected, and the first pixel circuit of the first pixel PX1 or the third pixel circuit of the third pixel PX3 which is arranged in an adjacent column.

The first pixel electrode PE1 may include the first region 123a where the first emission layer 121a is arranged, and the second region 125a extending from the first region 123a and corresponding to the first via hole VIA1. The first region 123a of the first pixel electrode PE1 may overlap at least one of the source region and the drain region of the third transistor T3 of the third pixel PX3 arranged in a same column and an adjacent row. The first region 123a of the first pixel electrode PE1 may overlap at least one of the source region and the drain region of the third transistor T3 of the second pixel PX2 arranged in an adjacent column and an adjacent row adjacent to the row of the first pixel electrode PE1. The first region 123a of the first pixel electrode PE1 may include a first protrusion 127a and a second protrusion 129a to overlap at least one of the source region and the drain region of the third transistor T3 of an adjacent pixel.

The second pixel electrode PE2 may include the first region 123b where the second emission layer 121b is arranged, and the second region 125b which extends from the first region 123b and corresponds to the second via hole VIA2.

The third pixel electrode PE3 may include the first region 123c where the third emission layer 121c is arranged, and the second region 125c which extends from the first region 123c and corresponds to the third via hole VIA3. The first region 123c of the third pixel electrode PE3 may overlap at least one of the source region and the drain region of the third transistor T3 of the first pixel PX1 arranged in a same column and an adjacent row. The first region 123c of the third pixel electrode PE3 may overlap at least one of the source region and the drain region of the third transistor T3 of the second pixel PX2 arranged in an adjacent column and an adjacent row. The first region 123c of the third pixel electrode PE3 may include a first protrusion 127c and a second protrusion 129c to overlap at least one of the source region and the drain region of the third transistor T3 of an adjacent pixel.

The first via hole VIA1, the second via hole VIA2, and the third via hole VIA3 may be arranged along a virtual fifth straight line IL5.

In the embodiments of FIGS. 16 and 17, at least a portion of the semiconductor layer of the third transistor T3 of each of the first to third pixels PX1 to PX3 may be shielded by the first pixel electrode PE1 of a first pixel PX1 or the third pixel electrode PE3 of a third pixel PX3 that is in an adjacent row.

The first region 123a of the first pixel electrode PE1 of a first pixel PX1 arranged in a row may overlap at least one of the source region and the drain region of the third transistor T3 of a third pixel PX3 that is arranged in a neighboring row adjacent to the row in the second direction. The first region 123a of the first pixel electrode PE1 of the first pixel PX1 may overlap at least one of the source region and the drain region of the third transistor T3 of a second pixel PX2 that is arranged in an adjacent row and an adjacent column in the second direction and the first direction, respectively.

The first region 123c of the third pixel electrode PE3 of a third pixel PX3 arranged in a row may overlap at least one of the source region and the drain region of the third transistor T3 of a first pixel PX1 that is arranged in an adjacent row in the second direction. The first region 123c of the third pixel electrode PE3 of the third pixel PX3 may overlap at least one of the source region and the drain region of the third transistor T3 of a second pixel PX2 that is arranged in an adjacent row and an adjacent column in the second direction and the first direction, respectively.

The first shielding member 130 may overlap a portion of the semiconductor layer of the second transistor T2 of each of the first to third pixels PX1 to PX3, for example, at least one of the source region and the drain region of the semiconductor layer.

Figure 18:
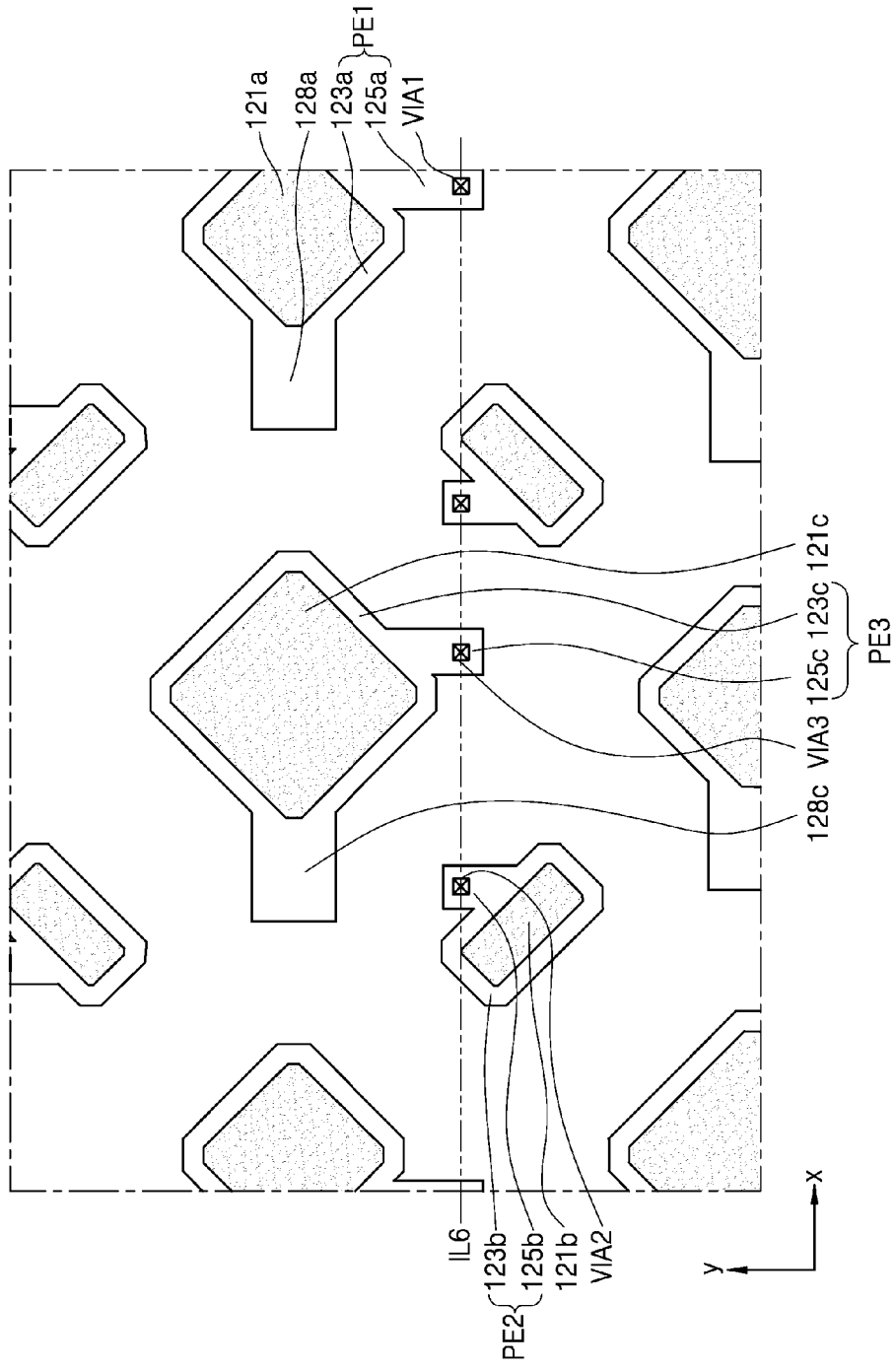
FIGS. 18 and 19 are plan views each illustrating a shielding member according to another embodiment of the disclosure.
Figure 19:
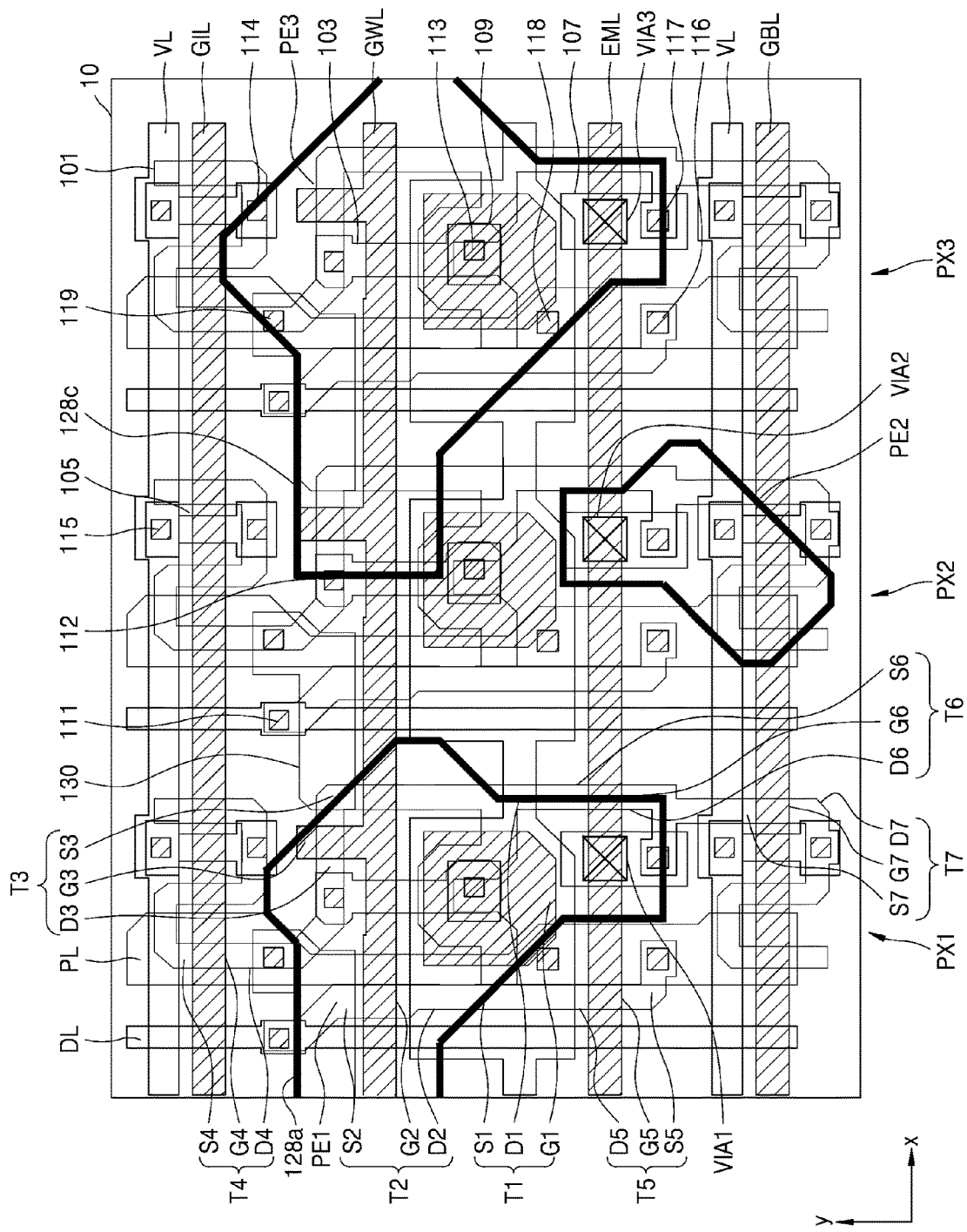

FIGS. 18 and 19 are schematic plan views each illustrating a shielding member according to an embodiment.

Referring to FIGS. 18 and 19, the display device 1 according to an embodiment may include a portion of a pixel electrode PE as a shielding member. Because the first to third pixel circuits of the first to third pixels PX1 to PX3 in the embodiments of FIGS. 18 and 19 are identical to those in the embodiments of FIGS. 8 and 9, descriptions of components in the embodiments of FIGS. 18 and 19 that are identical to those in the embodiments of FIGS. 7 to 9 will be omitted, and differences therebetween will be mainly described.

Referring to FIGS. 18 and 19, in each row, the first pixel circuit of the first pixel PX1 may be arranged in the first pixel region PX1a of the substrate 100, the second pixel circuit of the second pixel PX2 may be arranged in the second pixel region PX2a adjacent to the first pixel region PX1a of the substrate 100, and the third pixel circuit of the third pixel PX3 may be arranged in the third pixel region PX3a adjacent to the second pixel region PX2a of the substrate 100. Although not shown in FIGS. 18 and 19, the second pixel circuit of the second pixel PX2 may be arranged in the fourth pixel region PX4a adjacent to the third pixel region PX3a.

The fourth insulating layer 15 and the fifth insulating layer 16 may be arranged over the first to third pixel circuits. The first to third pixel electrodes PE1 to PE3 electrically connected to the first to third pixel circuits, respectively, may be arranged over the fifth insulating layer 16. The second shielding member 140 of FIGS. 7 to 9 may not be formed, and thus, the fifth insulating layer 16 may be omitted.

In a row, a first pixel electrode PE1 may at least partially overlap the first pixel circuit to which the first pixel electrode PE1 is electrically connected, and the second pixel circuit of a second pixel PX2 which is arranged in an adjacent column in the first direction. A third pixel electrode PE3 may at least partially overlap the third pixel circuit to which the third pixel electrode PE3 is electrically connected, and a second pixel circuit of a second pixel PX2 which is arranged in an adjacent column in the first direction. A second pixel electrode PE2 may at least partially overlap the second pixel circuit to which the second pixel electrode PE2 is electrically connected.

The first pixel electrode PE1 may include the first region 123a where the first emission layer 121a is arranged, and the second region 125a which extends from the first region 123a and corresponds to the first via hole VIA1. The first region 123a of the first pixel electrode PE1 may overlap at least one of the source region and the drain region of the third transistor T3 of the first pixel circuit to which the first pixel electrode PE1 is electrically connected. The first region 123a of the first pixel electrode PE1 may overlap at least one of the source region and the drain region of the third transistor T3 of a second pixel PX2 that is arranged in an adjacent column. The first region 123a of the first pixel electrode PE1 may include a protrusion 128a to overlap at least one of the source region and the drain region of the third transistor T3 of an adjacent pixel.

The second pixel electrode PE2 may include the first region 123b where the second emission layer 121b is arranged, and the second region 125b which extends from the first region 123b and corresponds to the second via hole VIA2.

The third pixel electrode PE3 may include the first region 123c where the third emission layer 121c is arranged, and the second region 125c which extends from the first region 123c and corresponds to the third via hole VIA3. The first region 123c of the third pixel electrode PE3 may overlap at least one of the source region and the drain region of the third transistor T3 of the third pixel circuit to which the third pixel electrode PE3 is electrically connected. The first region 123c of the third pixel electrode PE3 may overlap at least one of the source region and the drain region of the third transistor T3 of a second pixel PX2 that is arranged in an adjacent column. The first region 123c of the third pixel electrode PE3 may include a protrusion 128c to overlap at least one of the source region and the drain region of the third transistor T3 of an adjacent pixel.

The first via hole VIA1, the second via hole VIA2, and the third via hole VIA3 may be arranged along a virtual sixth straight line IL6.

In the embodiments of FIGS. 18 and 19, at least a portion of the semiconductor layer of the third transistor T3 of the first pixel PX1 may be shielded by the first pixel electrode PE1 of the first pixel PX1. At least a portion of the semiconductor layer of the third transistor T3 of the third pixel PX3 may be shielded by the third pixel electrode PE3 of the third pixel PX3. At least a portion of the semiconductor layer of the third transistor T3 of the second pixel PX2 may be shielded by the first pixel electrode PE1 of a first pixel PX1 or the third pixel electrode PE3 of a third pixel PX3 that is arranged in an adjacent column.

In a row, the first region 123a of the first pixel electrode PE1 of a first pixel PX1 may overlap at least one of the source region and the drain region of the third transistor T3 of the first pixel PX1. The first region 123a of the first pixel electrode PE1 of the first pixel PX1 may overlap at least one of the source region and the drain region of the third transistor T3 of a second pixel PX2 that is adjacent to the first pixel PX1 in the first direction.

In a row, the first region 123c of the third pixel electrode PE3 of a third pixel PX3 may overlap at least one of the source region and the drain region of the third transistor T3 of the third pixel PX3. The first region 123c of the third pixel electrode PE3 of the third pixel PX3 may overlap at least one of the source region and the drain region of the third transistor T3 of a second pixel PX2 that is adjacent to the third pixel PX3 in the first direction.

The first shielding member 130 may overlap a portion of the semiconductor layer of the second transistor T2 of each of the first to third pixels PX1 to PX3, for example, at least one of the source region and the drain region of the semiconductor layer.

Figure 20:
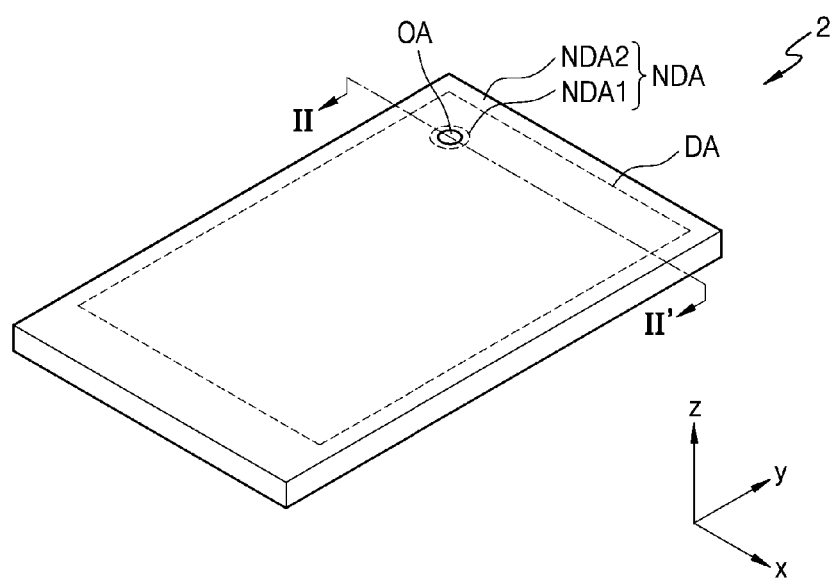
FIG. 20 is a schematic perspective view of a display device according to another embodiment of the disclosure.

FIG. 20 is a schematic perspective view of a display device according to an embodiment.

Referring to FIG. 20, a display device 2 according to an embodiment may further include an opening area OA in addition to the display device 1 of FIG. 1.

The opening area OA may be at least partially surrounded by the display area DA. In an embodiment, FIG. 20 illustrates that the opening area OA is entirely surrounded by the display area DA. The non-display area NDA may include a first non-display area NDA1 surrounding the opening area OA and a second non-display area NDA2 surrounding the display area DA. The first non-display area NDA1 may entirely surround the opening area OA, the display area DA may entirely surround the first non-display area NDA1, and the second non-display area NDA2 may entirely surround the display area DA.

Although FIG. 20 illustrates that the opening area OA is arranged on an upper left side of the display area DA, embodiments are not limited thereto. In an embodiment, the number of opening areas OA and positions thereof may vary.

Figure 21:
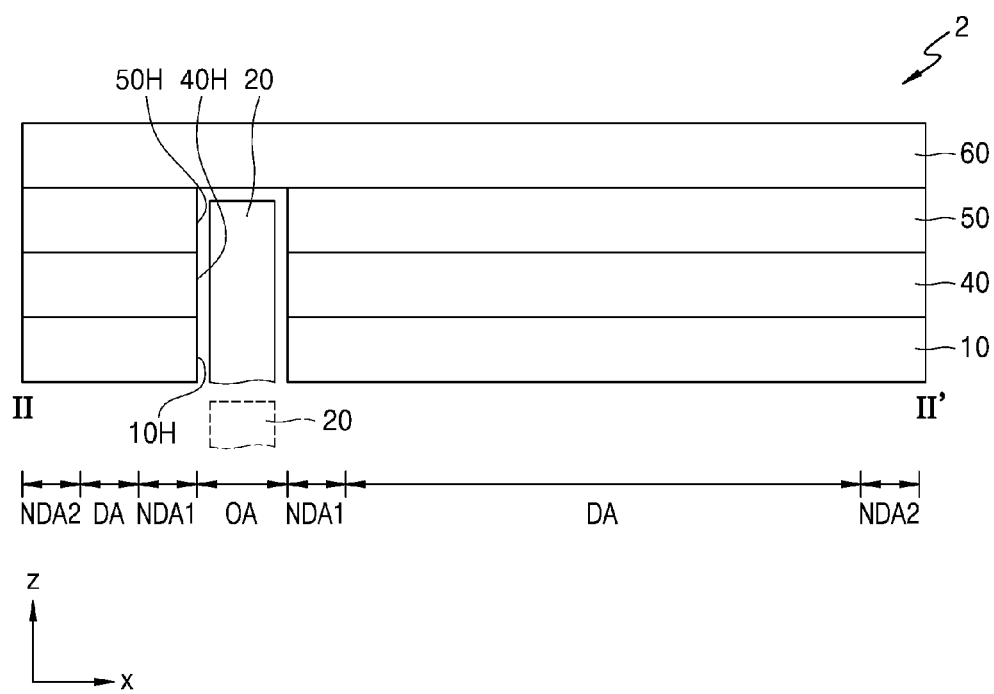
FIG. 21 is a cross-section taken along line II-II' of FIG. 20.

FIG. 21 is a schematic cross-sectional view of the display device 2 and may correspond to a cross-section taken along line II-II' of FIG. 20.

Although FIG. 1 illustrates only a display panel of the display device 1, FIG. 21 illustrates a display panel 10 of the display device 2 of FIG. 20 and an input sensing layer 40, an optical functional layer 50, and a window 60 arranged on the display panel 10. The input sensing layer 40, the optical functional layer 50, and the window 60 may be equally applicable to the display device 1 of FIG. 1.

The display panel 10 may include pixels arranged in the display area DA. Referring to FIGS. 3 and 4, each pixel may include a pixel circuit PC electrically connected to a scan line SL and a data line DL and a display element ED electrically connected to the pixel circuit PC. The pixel circuit PC may include a thin-film transistor and a capacitor, and the display element ED may include an organic light-emitting diode, an inorganic light-emitting diode, or a quantum-dot light-emitting diode. The display element ED may be arranged on a layer over the pixel circuit PC, and insulating layers may be arranged between the pixel circuit PC and the display element ED.

The input sensing layer 40 may obtain coordinate information corresponding to an external input, for example, a touch event. The input sensing layer 40 may include a sensing electrode (or a touch electrode) and trace lines electrically connected to the sensing electrode. The input sensing layer 40 may be arranged over the display panel 10. The input sensing layer 40 may sense an external input by a mutual capacitance method and/or a self-capacitance method.

The input sensing layer 40 may be directly formed on the display panel 10, or may be formed separately and coupled or connected to the display panel 10 by using an adhesive layer such as an optically clear adhesive (OCA). For example, the input sensing layer 40 may be formed right after the display panel 10 is formed. The adhesion layer may not be provided between the input sensing layer 40 and the display panel 10. FIG. 21 illustrates that the input sensing layer 40 is between the display panel 10 and the optical functional layer 50. However, in an embodiment, the input sensing layer 40 may be arranged over the optical functional layer 50.

The optical functional layer 50 may include an anti-reflection layer. The anti-reflection layer may reduce the reflectivity of light (external light) incident from an external source toward the display panel 10 through the window 60. The anti-reflection layer may include a phase retarder and a polarizer. The phase retarder may be of a film type or liquid coating type and may include a A/2 phase retarder and/or a A/4 phase retarder. The polarizer may also be of a film type or liquid coating type. The film type may include a stretchable synthetic resin film, and the liquid coating type may include liquid crystals arranged in an arrangement. The phase retarder and the polarizer may further include protective films, respectively. The phase retarder and the polarizer or the protective films thereof may be defined as a base layer of the anti-reflection layer.

In an embodiment, the anti-reflection layer may include a black matrix and color filters. The color filters may be arranged by taking into account the colors of light emitted by the pixels of the display panel 10. In an embodiment, the anti-reflection layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, and thus the reflectance of external light may be reduced.

The optical functional layer 50 may include a lens layer. The lens layer may improve the emission efficiency of light emitted from the display panel 10 or reduce a color deviation thereof. The lens layer may include a layer having a concave or convex lens shape, and/or include layers respectively having different refractive indexes. The optical functional layer 50 may include both the anti-reflection layer and the lens layer, or include one of the anti-reflection layer and the lens layer.

Each of the display panel 10, the input sensing layer 40, and the optical functional layer 50 may include an opening. FIG. 21 illustrates that the display panel 10, the input sensing layer 40, and the optical functional layer 50 respectively include first, second, and third openings 10H, 40H, and 50H and that the first, second, and third openings 10H, 40H, and 50H overlap each other. The first, second, and third openings 10H, 40H, and 50H may be positioned to correspond to the opening area OA. In an embodiment, at least one among the display panel 10, the input sensing layer 40, and/or the optical functional layer 50 may not include an opening. For example, one or two selected from the display panel 10, the input sensing layer 40, and the optical functional layer 50 may not include an opening. Hereinafter, the opening area OA may indicate at least one of the first to third openings 10H, 40H, and 50H respectively included in the display panel 10, the input sensing layer 40, and the optical functional layer 50. For example, the opening area OA used herein may indicate the first opening 10H of the display panel 10.

A component 20 may correspond to the opening area OA. The component 20 may be positioned within the first to third openings 10H, 40H, and 50H as indicated by a solid line of FIG. 21, or may be positioned below the display panel 10 as indicated by a dotted line of FIG. 21.

The component 20 may include an electronic element. For example, the component 20 may be an electronic element that uses light or sounds. For example, the electronic element may include a sensor that receives and uses light as an infrared sensor, a camera that receives light to capture an image, a sensor that outputs and senses light or sound to measure a distance or recognize a fingerprint or the like, a small lamp that outputs light, or a speaker that outputs sounds. An electronic element using light may use light in various wavelength bands, such as visible light, infrared light, and ultraviolet light. In some embodiments, the opening area OA may be understood as a transmission area capable of transmitting light or/and sound that is output from the component 20 to the outside or travels from the outside toward the component 20.

In an embodiment, in case that the display device 2 is used as a smartwatch or an instrument panel for automobiles, the component 20 may be a member including a needle of a clock, or a needle indicating predetermined information (e.g. a velocity of a vehicle). In case that the display device 2 includes hands of a clock or an instrument panel for automobiles, the component 20 may be exposed to the outside through window 60, and the window 60 may include an opening corresponding to the opening area OA.

As described above, the component 20 may include an element(s) related to a function of the display panel 10 or may include an element such as an accessory that increases an esthetic sense of the display panel 10. Although not shown in FIG. 21, a layer including an optical clear adhesive or the like may be positioned between the window 60 and the optical functional layer 50.

Figure 22A:
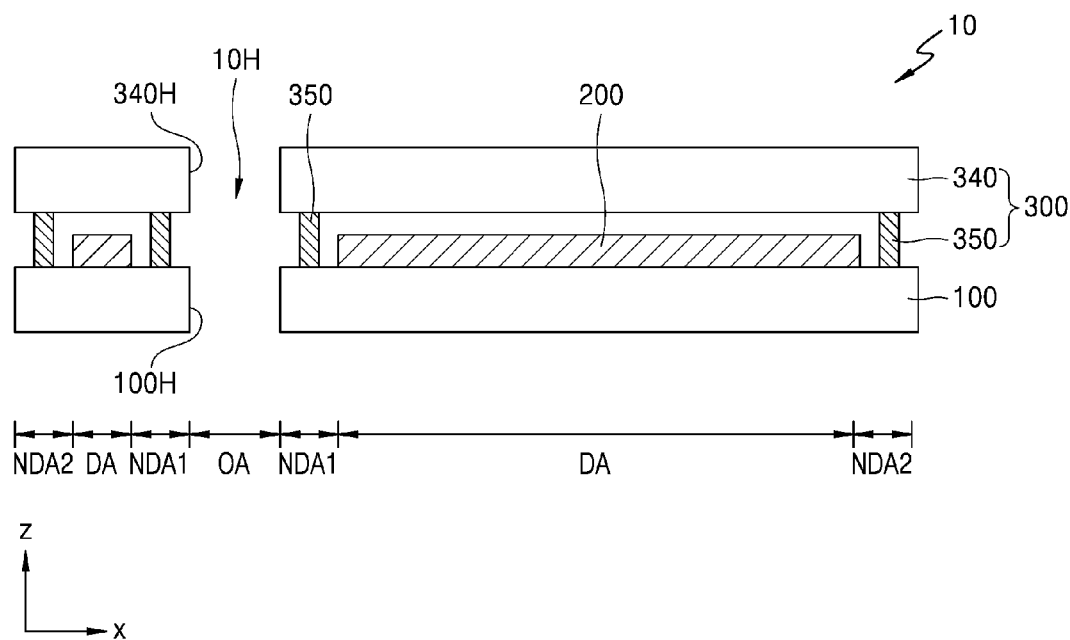
FIGS. 22A through 22C are schematic cross-sectional views of a display panel according to an embodiment.
Figure 22B:
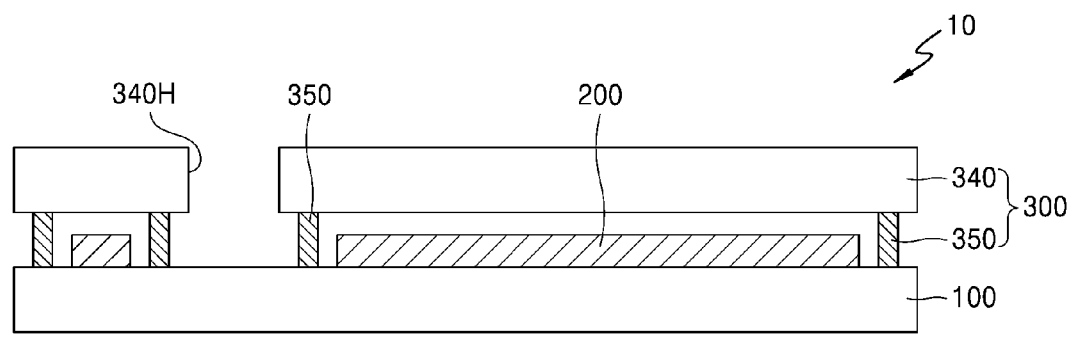
Figure 22C:
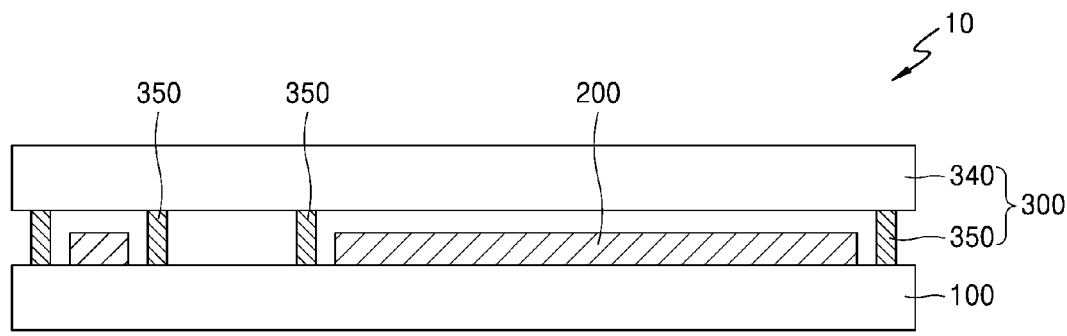

FIGS. 22A to 22C are schematic cross-sectional views of a display panel according to an embodiment.

Referring to FIGS. 22A to 22C, the display panel 10 may include a display element layer 200 arranged on the substrate 100. The substrate 100 may include a glass material or may include a polymer resin. For example, the substrate 100 may include a glass material mainly containing $SiO_2$, or may include a resin such as reinforced plastic.

The display element layer 200 may be an encapsulation member 300 and be covered by an encapsulation substrate 340 facing the substrate 100. A sealing material 350 may be arranged between the substrate 100 and the encapsulation substrate 340. The sealing material 350 may surround the display element layer 200 between the substrate 100 and the encapsulation substrate 340. For example, the sealing material 350 may surround a first edge (inner edge) of the display element layer 200 in a first non-display area NDA1 and surround a second edge (outer edge) of the display element layer 200 in a second non-display area NDA2. When viewed in a direction perpendicular to a main surface of the display panel 10, the opening area OA may be entirely surrounded by the sealing material 350, and the second edge of the display element layer 200 may be also entirely surrounded by the sealing material 350.

The display panel 10 may include a first opening 10H corresponding to the opening area OP. FIG. 22A illustrates that the substrate 100 and the encapsulation substrate 340 respectively include through holes 100H and 340H corresponding to the opening area OA. The display element layer 200 may include a through hole corresponding to the opening area OA.

In an embodiment, as shown in FIG. 22B, the encapsulation substrate 340 may include the through hole 340H corresponding to the opening area OA, but the substrate 100 may not include no through hole. The display element layer 200 may include a through hole corresponding to the opening area OA. In an embodiment, as shown in FIG. 22C, each of the substrate 100 and the encapsulation substrate 340 may not include a through hole corresponding to the opening area OA. The display element layer 200 may include a through hole corresponding to the opening area OA. In an embodiment, the sealing material 350 of the display panel 10 of FIG. 22C arranged in the first non-display area NDA1 may be omitted. The display element layer 200 may not include a through hole corresponding to the opening area OA. Since the component 20 of FIG. 21 that does not require a relatively high transmittance may be arranged in the opening area OA, the opening area OA may be used as a transmission area that transmits light used by the component 20. Even in case that the display element layer 200 may not include a through hole corresponding to the opening area OA, a portion of the display element layer 200 that corresponds to the opening area OA may transmit light by not including elements (e.g., a transistor, a storage capacitor, wiring, etc.) constituting (or forming) the pixel circuit PC of FIG. 3.

Figure 23A:
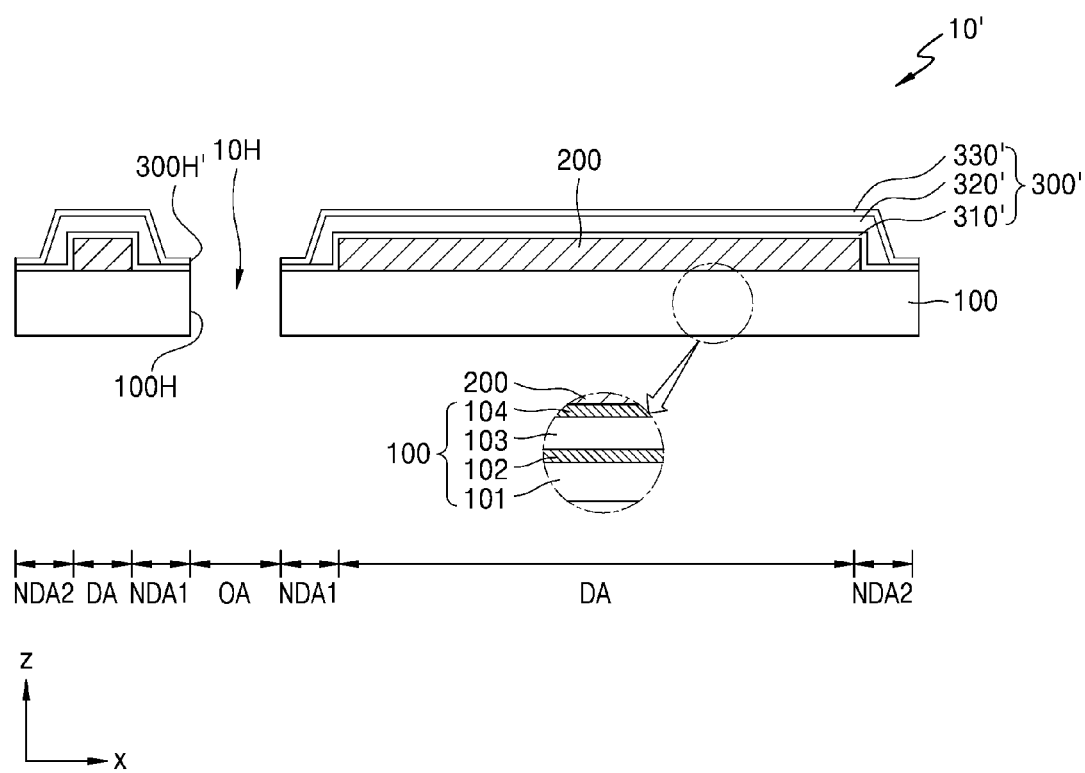
FIGS. 23A through 23C are schematic cross-sectional views of a display panel 10' according to another embodiment of the disclosure.
Figure 23B:
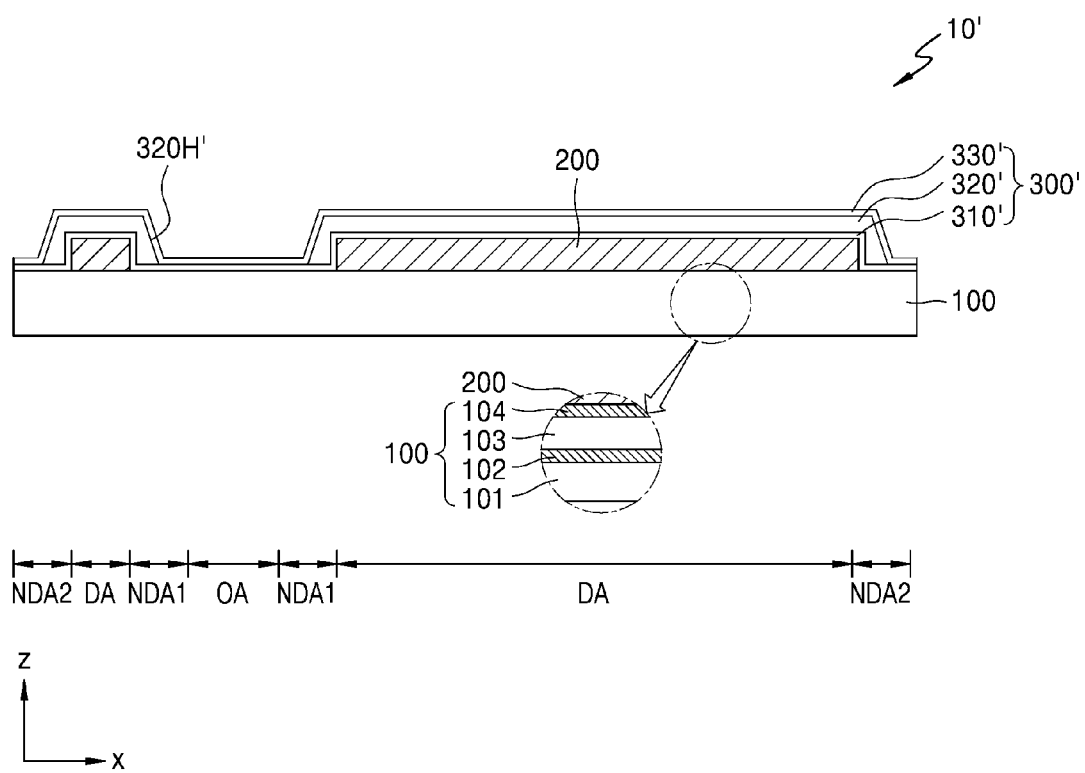
Figure 23C:
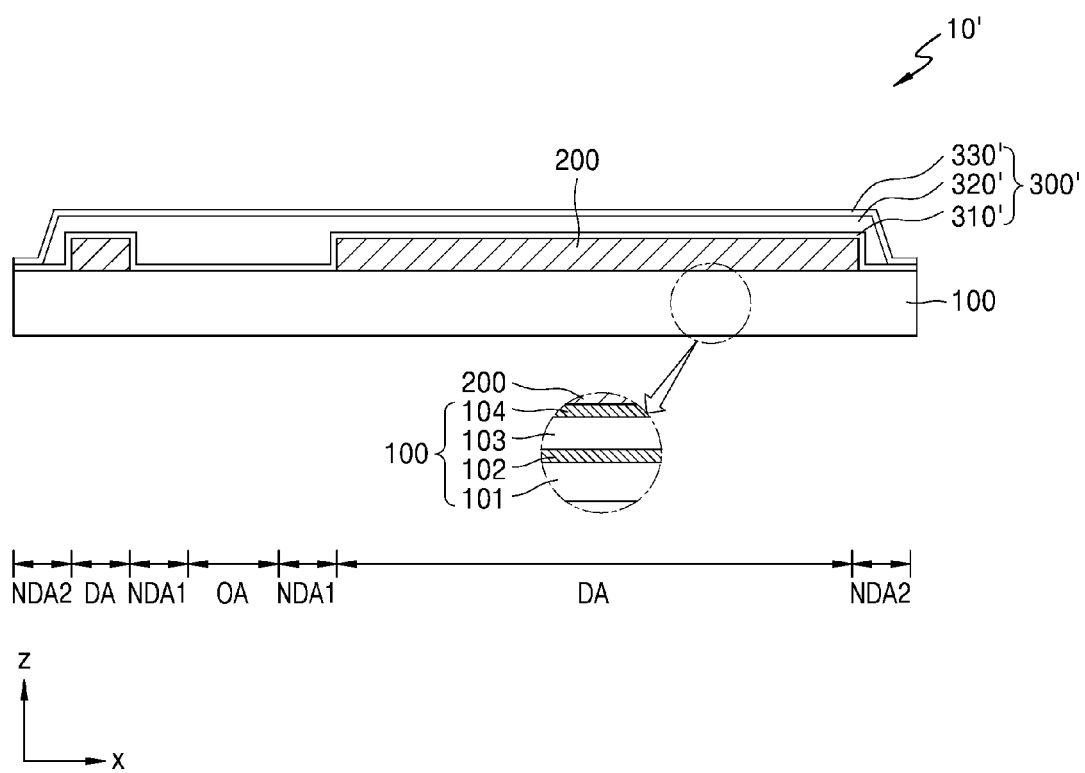

FIGS. 23A to 23C are schematic cross-sectional views of a display panel 10' according to an embodiment.

Referring to FIG. 23A, the display layer 200 may be arranged on the substrate 100, and the display layer 200 may be covered by a thin-film encapsulation layer, which is an encapsulation member 300'. The encapsulation member 300', which is the thin-film encapsulation layer, may include at least one inorganic encapsulation layer and at least one organic encapsulation layer. FIG. 23A illustrates first and second inorganic encapsulation layers 310' and 330' and an organic encapsulation layer 320' therebetween.

The first and second inorganic encapsulation layers 310' and 330' may include at least one inorganic material such as aluminum oxide, titanium oxide, tantalum oxide, hafnium oxide, zinc oxide, silicon oxide, silicon nitride, silicon oxynitride, or the like. The organic encapsulation layer 320' may include a polymer-based material. Examples of the polymer-based material may include an acrylic resin, an epoxy-based resin, polyimide, and polyethylene.

The substrate 100 may include a polymer resin and may be formed as multiple layers. For example, the substrate 100 may include a first base layer 101, a first barrier layer 102, a second base layer 103, and a second barrier layer 104 which are sequentially stacked each other.

Each of the first and second base layers 101 and 103 may include a polymer resin. For example, the first and second base layers 101 and 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). The aforementioned polymer resin may be transparent.

Each of the first and second barrier layers 102 and 104 may be a barrier layer preventing permeation of external foreign materials and may be a single-layer or a multi-layer including an inorganic material, for example, silicon nitride ($SiN_x$) or silicon oxide ($SiO_x$).

In case that the display panel 10' includes the substrate 100, which is a multi-layer, and the encapsulation member 300', which is a thin-film encapsulation layer, the flexibility of the display panel 10' may be improved.

Referring to FIG. 23A, the display panel 10' may include through holes 100H and 300H' respectively penetrating through the substrate 100 and the encapsulation member 300', which is the thin-film encapsulation layer, to correspond the first opening 10H of the display panel 10'. The display element layer 200 may include a through hole corresponding to the opening area OA.

In an embodiment, as shown in FIG. 23B, the organic encapsulation layer 320' of the encapsulation member 300', which is the thin-film encapsulation layer, may include a through hole 320H' corresponding to the opening area OA, but the substrate 100 and the first and second inorganic encapsulation layers 310' and 330' may not include through holes. In an embodiment, as shown in FIG. 23C, layers that constitute the encapsulation member 300', which is the thin-film encapsulation layer, may not include a through hole corresponding to the opening area OA. In other words, the first and second inorganic encapsulation layers 310' and 330' and the organic encapsulation layer 320' may cover the opening area OA. In an embodiment, in case that the opening area OA is used as a transmission area that transmits light, for example, the component 20 of FIG. 21 not requiring a high transmittance is arranged in the opening area OA, the display element layer 200 may not include a through hole corresponding to the opening area OA, unlike that shown in FIGS. 23A to 23C. Even in case that the display element layer 200 does not include a through hole corresponding to the opening area OA, a portion of the display element layer 200 that corresponds to the opening area OA may transmit light by not including elements (e.g., a transistor, a storage capacitor, wiring, etc.) constituting the pixel circuit PC of FIG. 3.

Figure 24:
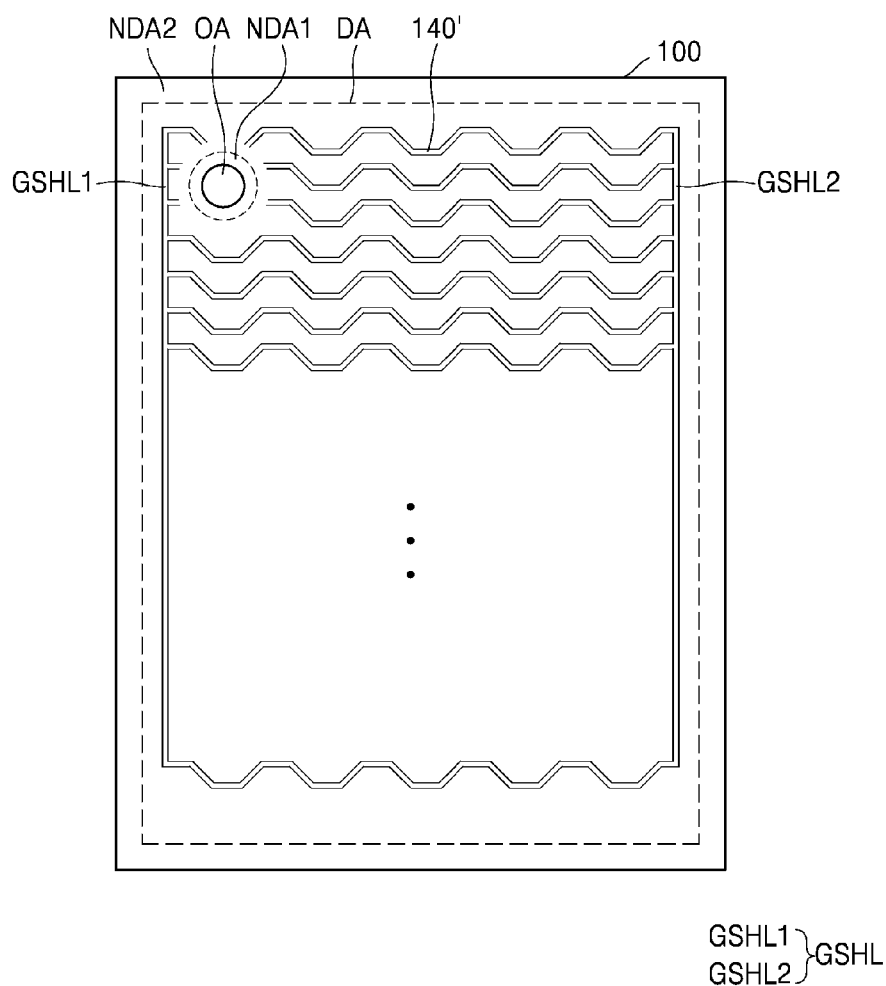
FIGS. 24 and 25 are plan views of examples of a shielding member of the display device of FIG. 20.
Figure 25:
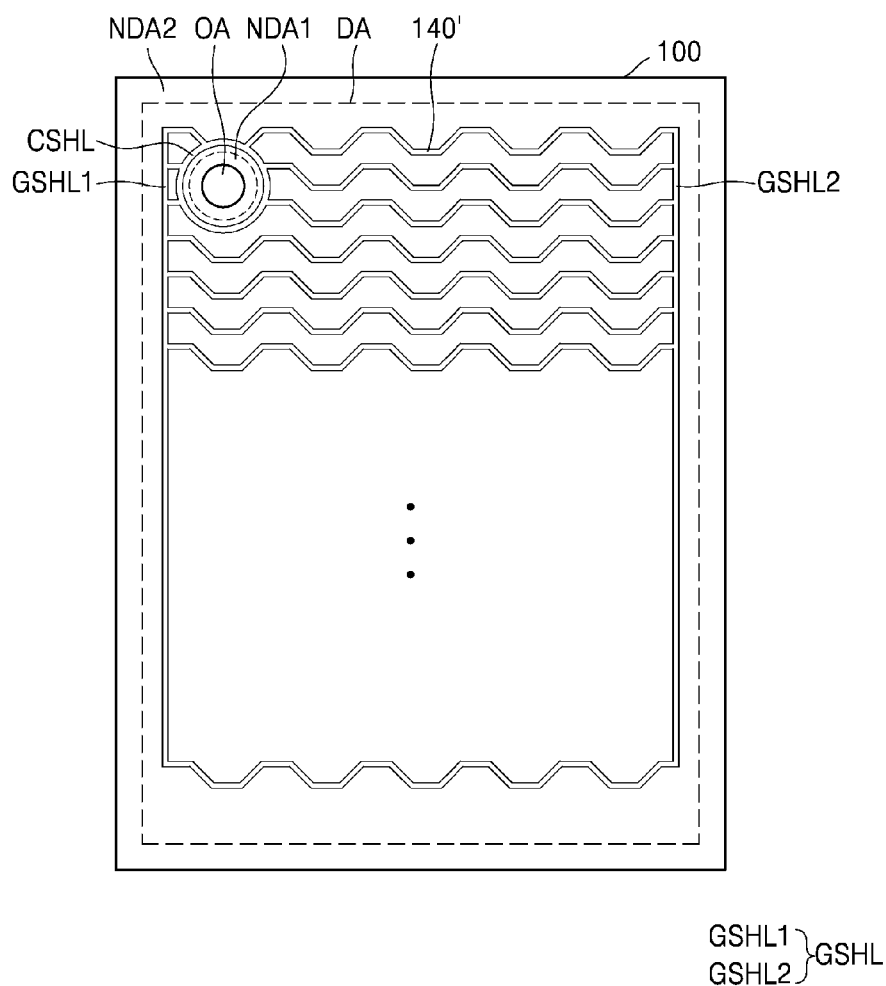

FIGS. 24 and 25 are schematic plan views of examples of a shielding member of the display device of FIG. 20.

Referring to FIG. 24, the display device 2 according to an embodiment may include a second shielding member 140' arranged in each row to extend in the first direction. FIGS. 24 and 25 illustrate only the second shielding member 140' for convenience of explanation, and pixel circuits, pixel electrodes, and the first shielding member 13 other than the second shielding member 140' are omitted. The omitted components may be equally applicable to the description given in the embodiments of FIGS. 1 to 12.

The second shielding member 140' may be arranged over the fourth insulating layer 15 of FIG. 9 or 12. The second shielding member 140' may overlap a portion of the semiconductor layer of the third transistor T3 of the second pixel PX2, for example, at least one of the source region and the drain region of the semiconductor layer.

The second shielding member 140' may extend in the first direction along respective portions of the respective edges of first, second, and third pixel electrodes PE1, PE2, and PE3 arranged in each row so as not to overlap the first, second, and third pixel electrodes PE1, PE2, and PE3, and may be positioned over or below each row. The second shielding member 140' may have a straight line shape or zigzag shape in the second direction according to an arrangement of pixel electrodes. For example, in case that pixel electrodes are arranged as shown in FIG. 6, the second shielding member 140' may have a zigzag shape.

Referring to FIG. 24, the second shielding member 140' may be arranged in each row to extend in the first direction to overlap the semiconductor layers of the respective third transistors T3 of the second pixels PX2, and the second shielding members 140' arranged in the rows may be electrically connected to one another by a common shield line GSHL. The common shield line GSHL may include a first common shield line GSHL1 connecting respective ends of the second shielding members 140' and a second common shield line GSHL2 connecting respective other ends of the second shielding members 140'. The common shield line GSHL may be integral with the second shielding members 140', or may be arranged on a separate layer from the second shielding members 140' and may be electrically connected to the second shielding members 140'. The second shielding members 140' and the common shield line GSHL may be arranged within the display area DA. The second shielding members 140' may be disconnected in the opening area OA.

In an embodiment, the second shielding members 140' and the common shield line GSHL may be in a floating state. In an embodiment, the second shielding members 140' and the common shield line GSHL may receive the initializing voltage Vint or the second power supply voltage ELVSS. For example, the first common shield line GSHL1 may be electrically connected to the second power supply voltage line 150 of FIG. 15 arranged in the non-display area NA to receive the second power supply voltage ELVSS.

Referring to FIG. 25, the second shielding members 140' may be electrically connected to a detour line CSHL that surrounds the first non-display area NDA1. The detour line CSHL may be integral with the second shielding members 140'. The detour line CSHL and the second shielding members 140' may be arranged on a same layer, or may be arranged on different layers, and may be electrically connected to each other.

FIG. 25 illustrates that the detour line CSHL surrounds the first non-display area NDA1. However, in an embodiment, the detour line CSHL may be arranged in the first non-display area NDA1 by surrounding the opening area OA.

In the above-described embodiments, the first to third pixel electrodes PE1 to PE3 of the first to third pixels PX1 to PX3 may be arranged in a zigzag manner in the first direction. However, embodiments are not limited thereto, and the first to third pixel electrodes PE1 to PE3 of the first to third pixels PX1 to PX3 may be arranged side by side in the first direction to have a stripe structure. A second shielding member may have a straight line shape and may overlap at least one of the source region and the drain region of the third transistor T3 of each of the first to third pixels PX1 to PX3.

Although an organic light-emitting display device has been illustrated as the display devices 1 and 2 according to the embodiments, the embodiments are not limited thereto. In an embodiment, various types of display devices such as an inorganic light-emitting display and a quantum dot light-emitting display may be used. The display devices 1 and 2 may be various electronic devices such as mobile phones, laptop computers, and smartwatches.

While the disclosure has been particularly shown and described with reference to embodiments thereof, it will be understood by those of ordinary skill in the art that various changes in form and details may be made therein without departing from the spirit and scope as defined by the following claims.

What is claimed is:

1. A display device comprising:
a first pixel circuit arranged in a first pixel region, the first pixel circuit comprising a first thin-film transistor including a first semiconductor layer;
a second pixel circuit arranged in a second pixel region adjacent to the first pixel region, the second pixel circuit comprising a second thin-film transistor including a second semiconductor layer;
a first pixel electrode electrically connected to the first pixel circuit;
a second pixel electrode electrically connected to the second pixel circuit; and
a shielding member in a display area and extending along a portion of edges of the first pixel electrode and the second pixel electrode in a plan view, wherein
the first pixel electrode at least partially overlaps the first semiconductor layer of the first thin-film transistor,
the shielding member at least partially overlaps the second semiconductor layer of the second thin-film transistor,
the first pixel electrode and the second pixel electrode are in a same layer,
the shielding member is in a layer between the second pixel electrode and the second thin-film transistor, and
the shielding member is spaced apart from the first pixel electrode and the second pixel electrode, and does not overlap both of the first pixel electrode and the second pixel electrode in a plan view.

2. The display device of claim 1, wherein the shielding member is extending in a row direction and connected to other shielding members arranged in rows.

3. The display device of claim 1, wherein the shielding member is floating.

4. The display device of claim 1, wherein the shielding member has a constant voltage.

5. The display device of claim 1, wherein the second pixel circuit further comprises:
a capacitor comprising:
a first electrode, the first electrode and a gate electrode of the second thin-film transistor being arranged in a same layer; and
a second electrode arranged over the first electrode; and
a switching thin-film transistor electrically connected to a data line arranged over the capacitor, and
the shielding member is arranged e in a layer between the data line and the second pixel electrode.

6. The display device of claim 5, wherein
the second pixel circuit further comprises:
an electrode pattern at least partially overlapping a semiconductor layer of the switching thin-film transistor, the electrode pattern and the second electrode of the capacitor being arranged in a same layer, and
the data line at least partially overlaps the electrode pattern.

7. The display device of claim 1, further comprising:
an opening area;
a display area at least partially surrounding the opening area; and
a non-display area located between the opening area and the display area and surrounding the opening area,
wherein the shielding member is disconnected in the non-display area.

8. The display device of claim 7, further comprising a detour line surrounding the opening area,
wherein the shielding member is connected to the detour line.

9. The display device of claim 8, wherein the detour line and the shielding member are arranged in a same layer.

10. A display device comprising:
a first pixel circuit arranged in a first pixel region in a first row, the first pixel circuit comprising a first thin-film transistor including a first semiconductor layer in a display area;
a second pixel circuit arranged in a second pixel region in the first row, the second pixel region being adjacent to the first pixel region, the second pixel circuit comprising a second thin-film transistor including a second semiconductor layer in the display area;
a third pixel circuit arranged in a third pixel region in a second row adjacent to the first row, the third pixel region being adjacent to the first pixel region, the third pixel circuit comprising a third thin-film transistor including a third semiconductor layer in the display area;
a first pixel electrode electrically connected to the first pixel circuit;
a second pixel electrode electrically connected to the second pixel circuit;
a third pixel electrode electrically connected to the third pixel circuit; and
a shielding member in the display area and extending along a portion of edges of the first pixel electrode, the second pixel electrode, and the third pixel electrode, wherein
the third pixel electrode at least partially overlaps the first semiconductor layer of the first thin-film transistor in the first pixel region in the first row,
the shielding member at least partially overlaps the second semiconductor layer of the second thin-film transistor in the second pixel region in the first row,
the first pixel electrode, the second pixel electrode and the third pixel electrode are in a same layer,
the shielding member is in a layer between the second pixel electrode and the second thin film transistor, and
the shielding member is spaced apart from the first pixel electrode, the second pixel electrode and the third pixel electrode, and does not overlap the first pixel electrode, the second pixel electrode and third pixel electrode in a plan view.

11. The display device of claim 10, wherein the shielding member is extending in a row direction and connected to other shield members in rows.

12. The display device of claim 10, wherein the shielding member is floating.

13. The display device of claim 10, wherein the shielding member has a constant voltage.

14. The display device of claim 10, wherein
the second pixel circuit further comprises:
 a capacitor comprising:
  a first electrode, the first electrode and a gate electrode of the second thin-film transistor being arranged in a same layer; and
  a second electrode arranged over the first electrode; and
 a switching thin-film transistor electrically connected to a data line arranged over the capacitor, and
the shielding member is arranged in a layer between the data line and the second pixel electrode.

15. The display device of claim 14, wherein
the second pixel circuit further comprises:
 an electrode pattern at least partially overlapping a semiconductor layer of the switching thin-film transistor, the electrode pattern and the second electrode of the capacitor being arranged in a same layer, and
the data line at least partially overlaps the electrode pattern.

16. The display device of claim 10, further comprising:
an opening area;
a display area at least partially surrounding the opening area; and
a non-display area located between the opening area and the display area and surrounding the opening area,
wherein the shielding member is disconnected in the non-display area.

17. The display device of claim 16, further comprising a detour line surrounding the opening area,
 wherein the shielding member is connected to the detour line.

18. The display device of claim 17, wherein the detour line and the shielding member are arranged in a same layer.

19. A display device comprising:
 a first pixel circuit arranged in a first pixel region, the first pixel circuit comprising a first thin-film transistor including a first semiconductor layer;
 a first light-emitting diode electrically connected to the first pixel circuit;
 a second pixel circuit arranged in a second pixel region adjacent to the first pixel region, the second pixel circuit comprising a second thin-film transistor including a second semiconductor layer; and
 a second light-emitting diode electrically connected to the second pixel circuit,
 wherein the first pixel region and the second pixel region are in a same row,
 wherein each of the first light-emitting diode and the second light-emitting diode comprises:
 a pixel electrode;
 a counter electrode facing the pixel electrode; and
 an intermediate layer between the pixel electrode and the counter electrode and including an emission layer,
 wherein the pixel electrode of the first light-emitting diode comprises:
 a first portion that overlaps at least one of a source area and a drain area of the first semiconductor layer of the first thin-film transistor in the first pixel region, and
 a second portion that overlaps at least one of a source area and a drain area of the second semiconductor layer of the second thin-film transistor in the second pixel region,
 wherein each of the first pixel circuit and the second pixel circuit further comprises a switching thin film transistor electrically connected to a data line transmitting a data signal, and
 wherein the emission layer of the first light-emitting diode overlaps a part of the data line connected to switching thin-film transistor of the first pixel circuit.

20. The display device of claim 19, wherein
each of the first pixel circuit and the second pixel circuit further comprises:
 a capacitor comprising a first electrode and a second electrode over the first electrode; and
 an electrode pattern at least partially overlapping a semiconductor layer of the switching thin-film transistor, and
wherein the data line at least partially overlaps the electrode pattern.

21. The display device of claim 1, wherein
the first pixel circuit includes a plurality of transistors including the first thin-film transistor, and
the second pixel circuit includes a corresponding plurality of transistors including the second thin-film transistor.

22. The display device of claim 1, wherein:
the shielding member has a first portion that extends in a row direction corresponding to a first direction in a plan view, the shielding member has a second portion extending in a second direction intersecting the first direction at an obtuse angle in a plan view,
the first portion of the shielding member has a first length and the second portion of the shielding member has a second length less than the first length; and
the shielding member a single continuous member having a plurality of the first portions intersecting a plurality of the second portions at the obtuse angle, respectively.

23. The display device of claim 20, wherein
the first electrode of the capacitor of the second pixel circuit and a gate electrode of the second thin-film transistor of the second pixel circuit are arranged in a same layer, and
the first electrode of the capacitor of the first pixel circuit and a gate electrode of the first thin-film transistor of the first pixel circuit are arranged in a same layer.

24. The display device of claim 19, wherein the pixel electrode of the first light-emitting diode overlaps at least one of a source area and a drain area of the switching thin-film transistor of the first pixel circuit.

25. The display device of claim 19, wherein:
the first portion of the pixel electrode of the first light-emitting diode overlaps a channel area between the source area and the drain area of the first semiconductor layer of the first thin-film transistor in the first pixel region, and
the second portion of the pixel electrode of the first light-emitting diode overlaps a channel area between the source area and the drain area of the second semiconductor layer of the second thin-film transistor in the second pixel region.

* * * * *